United States Patent
Toujo

(10) Patent No.: US 12,406,793 B2
(45) Date of Patent: Sep. 2, 2025

(54) COIL COMPONENT AND FILTER CIRCUIT INCLUDING THE SAME

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1029 days.

(21) Appl. No.: 17/469,995

(22) Filed: Sep. 9, 2021

(65) Prior Publication Data

US 2021/0407728 A1 Dec. 30, 2021

Related U.S. Application Data

(63) Continuation of application No. PCT/JP2020/036649, filed on Sep. 28, 2020.

(30) Foreign Application Priority Data

Oct. 30, 2019 (JP) ................. 2019-197531

(51) Int. Cl.
| | |
|---|---|
| H01F 27/29 | (2006.01) |
| H01F 27/28 | (2006.01) |
| H01F 41/04 | (2006.01) |
| H03H 7/01 | (2006.01) |

(52) U.S. Cl.
CPC ......... *H01F 27/2804* (2013.01); *H01F 27/29* (2013.01); *H01F 41/041* (2013.01); *H03H 7/0115* (2013.01); *H01F 2027/2809* (2013.01)

(58) Field of Classification Search
CPC .... H01F 27/2804; H01F 27/29; H01F 41/041; H01F 2027/2809; H01F 19/04; H01F 27/292; H03H 7/0115; H03H 2001/0085; H03H 7/1708; H03H 7/1758
USPC .......................................... 336/83, 200, 232
See application file for complete search history.

(56) References Cited

U.S. PATENT DOCUMENTS

| | | | |
|---|---|---|---|
| 2013/0154783 A1 | 6/2013 | Kato | |
| 2014/0333407 A1 | 11/2014 | Otsubo | |
| 2020/0279684 A1 | 9/2020 | Toujo | |

FOREIGN PATENT DOCUMENTS

| | | | | |
|---|---|---|---|---|
| JP | 08-130115 A | | 5/1996 | |
| JP | H08130117 A | | 5/1996 | |
| JP | 2001160728 A | * | 6/2001 | ........... H03H 1/0007 |
| JP | 2003234212 A | * | 8/2003 | |
| JP | 2013128022 A | | 6/2013 | |

(Continued)

OTHER PUBLICATIONS

Official Communication issued in International Patent Application No. PCT/JP2020/036649 mailed on Nov. 17, 2020.
Office Action in JP2021-158299, mailed Oct. 18, 2022, 5 pages.

*Primary Examiner* — Tuyen T Nguyen
(74) *Attorney, Agent, or Firm* — Keating & Bennett, LLP

(57) ABSTRACT

A coil component includes first and second coils magnetically coupled with each other. The coil component includes a multilayer body, and first and second wiring patterns each having a rectangular or substantially rectangular shape. At least one of the first and second coils includes at least one combination of wiring patterns that are stacked on each other with a positional displacement so as to include an intersecting portion where corresponding sides of the wiring patterns intersect with each other as viewed from a direction of main surfaces.

16 Claims, 14 Drawing Sheets

(56) References Cited

FOREIGN PATENT DOCUMENTS

WO 2013/146568 A1 10/2013
WO 2019187251 A1 10/2019

* cited by examiner

COIL COMPONENT AND FILTER CIRCUIT INCLUDING THE SAME

CROSS REFERENCE TO RELATED APPLICATIONS

This application claims the benefit of priority to Japanese Patent Application No. 2019-197531 filed on Oct. 30, 2019 and is a Continuation Application of PCT Application No. PCT/JP2020/036649 filed on Sep. 28, 2020. The entire contents of each application are hereby incorporated herein by reference.

BACKGROUND OF THE INVENTION

1. Field of the Invention

The present disclosure relates to a coil component and a filter circuit including the coil component.

2. Description of the Related Art

In electronic devices, noise control using a filter circuit is frequently performed. An example of a filter circuit used for noise control is an EMI (Electro-Magnetic Interference) suppression filter. The EMI suppression filter allows necessary components of a current flowing through a conductor to pass therethrough and removes unwanted components. On the other hand, the filter circuit includes a capacitor, which is a capacitance element, and it is known that equivalent series inductance (ESL), which is parasitic inductance of this capacitor, reduces the noise reduction effect.

A technology for extending the noise reduction effect of a filter circuit to a wider frequency range is known. In this technology, a negative inductance component generated by magnetic coupling of two coils is used to cancel out equivalent series inductance ESL of a capacitor of a filter circuit (see, for example, Japanese Unexamined Patent Application Publication No. 2001-160728, for example).

In the filter circuit, mutual inductance M generated by magnetic coupling of the two coils is used to cancel out equivalent series inductance ESL of the capacitor. It is thus important to manufacture the filter circuit so that mutual inductance M can be maintained at a substantially constant value. The value of mutual inductance M is determined by the inductance values of the two coils and the coupling coefficient between the two coils. The coupling coefficient is determined by the distance between the two coils and how much they are displaced from each other.

If the two coils are formed in a multilayer structure including wiring patterns stacked on each other, a stacking misalignment between layers of wiring patterns may occur during a manufacturing process. With the occurrence of a stacking misalignment, the inductance values of the individual coils and the coupling coefficient between the coils are significantly varied. In this manner, it is not possible to manufacture a coil component and a filter circuit including the same so that mutual inductance M can be maintained at a substantially constant value.

SUMMARY OF THE INVENTION

Preferred embodiments of the present invention provide coil components that are each able to be manufactured so that a mutual inductance is maintained at a constant or substantially constant value and filter circuits each including such coil components.

A coil component according to a preferred embodiment of the present disclosure includes first and second coils that are magnetically coupled with each other. The coil component includes a ceramic base body, at least one first wiring pattern, and at least one second wiring pattern. The ceramic base body includes a plurality of ceramic layers stacked on each other, a pair of main surfaces opposing each other, and side surfaces connecting the main surfaces. The at least one first wiring pattern is disposed inside the ceramic base body and defines at least a portion of the first coil. The at least one second wiring pattern is disposed on a top layer of the first wiring pattern and defines at least a portion of the second coil. Each of the first and second wiring patterns has a rectangular or substantially rectangular shape. At least one of the first and second coils includes at least one combination of wiring patterns that are stacked on each other with a positional displacement so as to include an intersecting portion at which corresponding sides of the wiring patterns intersect with each other as viewed from a direction of the main surfaces.

A filter circuit according to a preferred embodiment of the present disclosure includes a coil component according to a preferred embodiment of the present invention and a capacitor connected to an electrode disposed between the first and second coils of the coil component.

According to preferred embodiments of the present disclosure, the coils include at least one combination of wiring patterns that are stacked on each other with a positional displacement so as to include an intersecting portion at which corresponding sides of the wiring patterns intersect with each other as viewed from the direction of the main surfaces. With this configuration, even with the occurrence of a stacking misalignment between layers of wiring patterns, variations of the value of the mutual inductance can be reduced. It is thus possible to manufacture coil components so that the mutual inductance is able to be maintained at a constant or substantially constant value.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Coil components according to preferred embodiments of the present invention and filter circuits each including the same will be described below with reference to the drawings.

First Preferred Embodiment

Figure 1:
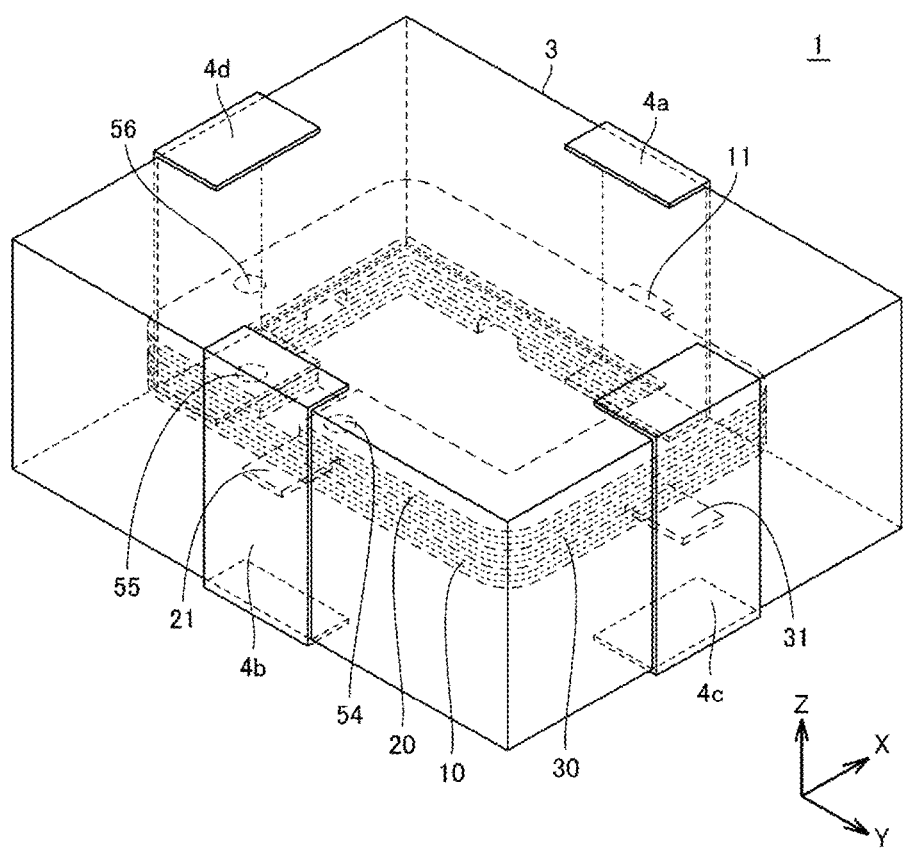
FIG. 1 is a perspective view of a coil component according to a first preferred embodiment of the present invention.
Figure 2:
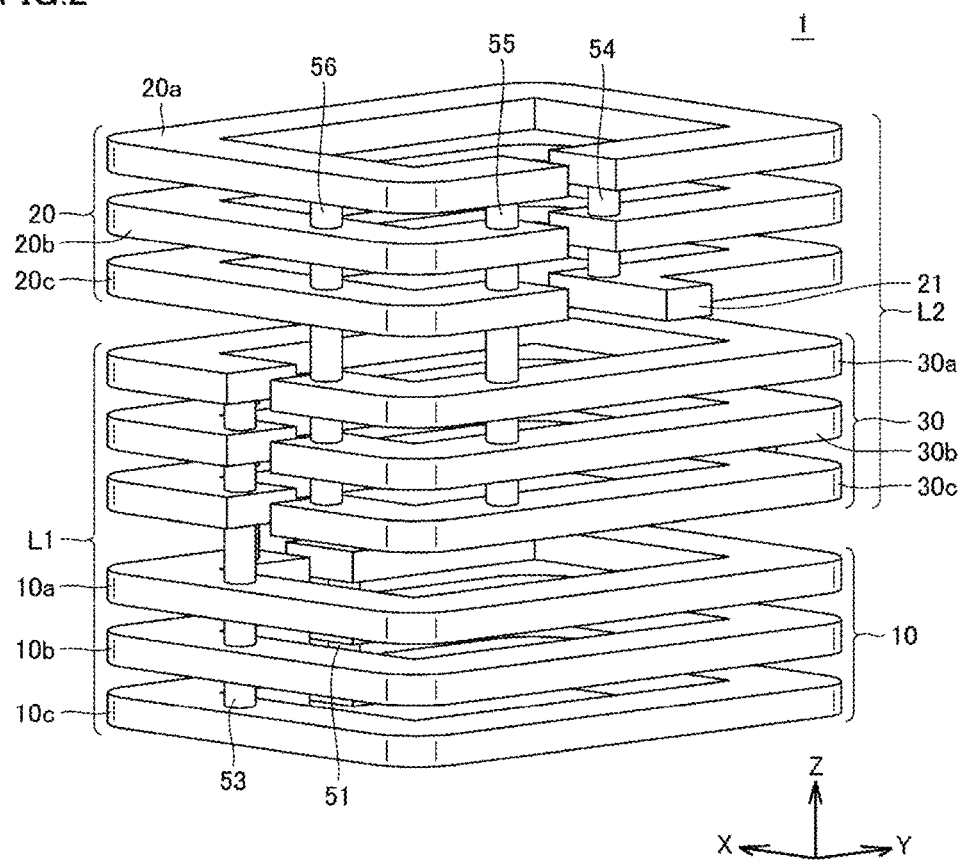
FIG. 2 is a perspective view illustrating the structure of wiring patterns of the coil component according to the first preferred embodiment of the present invention.
Figure 3:
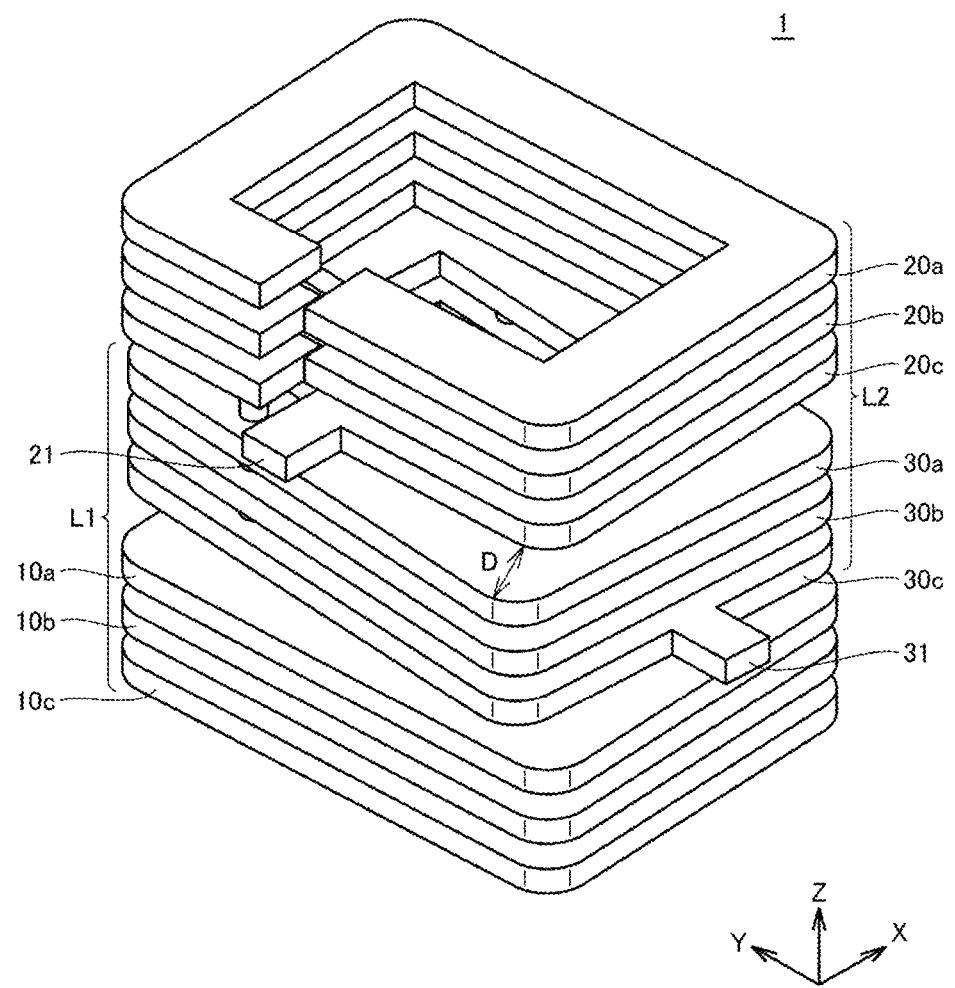
FIG. 3 is a perspective view illustrating a positional displacement between wiring patterns of the coil component according to the first preferred embodiment of the present invention.
Figure 4:
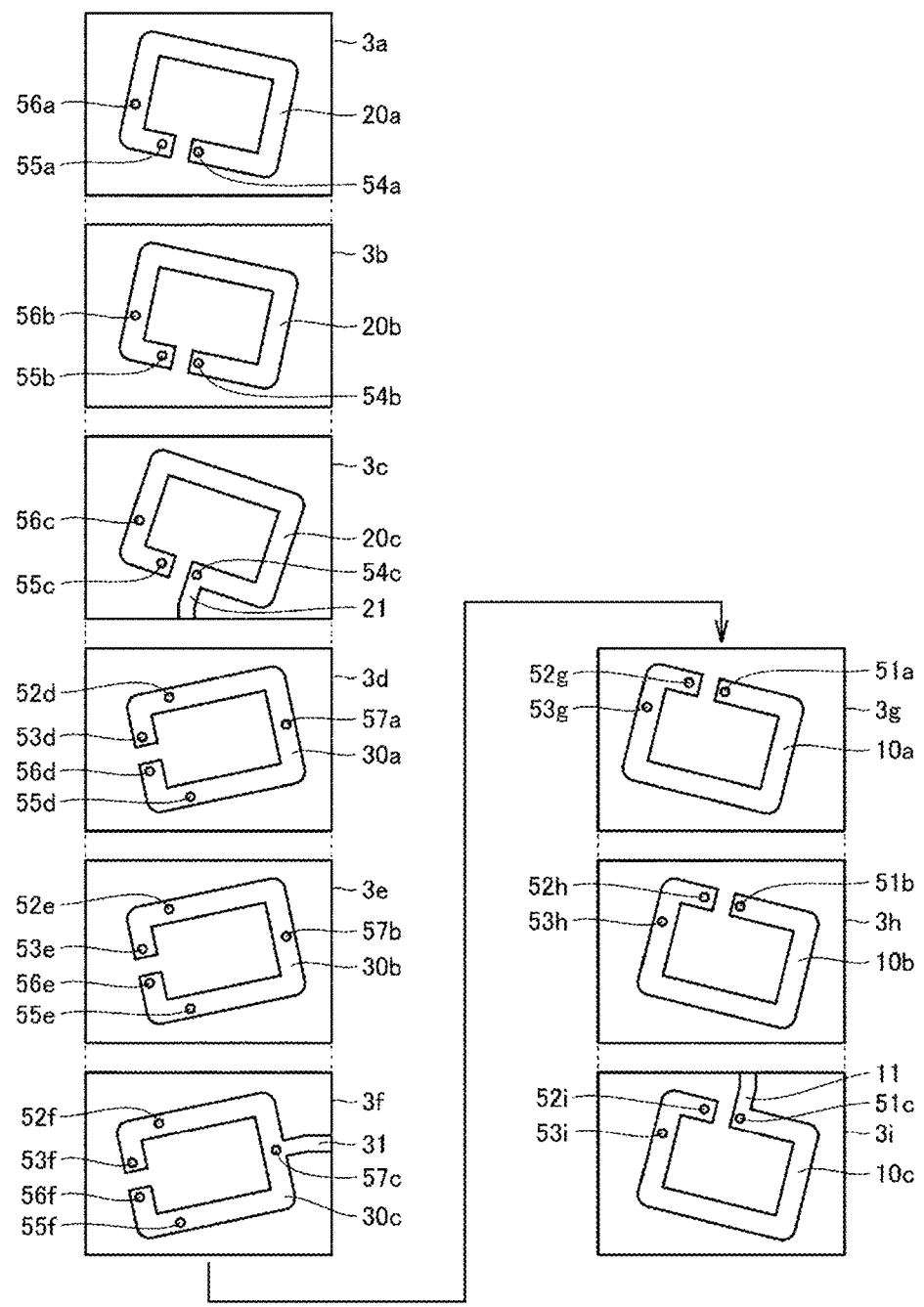
FIG. 4 is an exploded plan view illustrating the configuration of the coil component according to the first preferred embodiment of the present invention.
Figure 5:
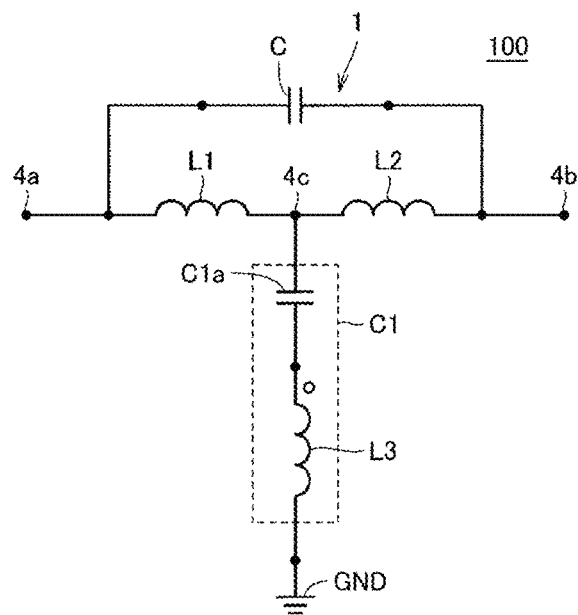
FIG. 5 is a circuit diagram of a filter circuit including the coil component of the first preferred embodiment of the present invention.

A coil component according to a first preferred embodiment of the present invention will be described below with reference to the drawings. FIG. 1 is a perspective view of the coil component according to the first preferred embodiment. FIG. 2 is a perspective view illustrating the structure of wiring patterns of the coil component according to the first preferred embodiment. FIG. 3 is a perspective view illustrating a positional displacement between wiring patterns of the coil component according to the first preferred embodiment. FIG. 4 is an exploded plan view illustrating the configuration of the coil component according to the first preferred embodiment. FIG. 5 is a circuit diagram of a filter circuit including the coil component of the first preferred embodiment. In FIGS. 1 through 3, the direction of the short sides of a coil component 1 is the X direction, the direction of the long side thereof is the Y direction, and the direction of the height thereof is the Z direction. The stacking direction of substrates is the Z direction, and a higher layer of the substrates is indicated by the arrow of the Z direction. Although a positional displacement between wiring patterns is shown in FIG. 3, it is omitted in FIGS. 1 and 2 for the sake of simple description.

A filter circuit 100 is an EMI suppression filter and is a third-order T-type LC filter circuit, for example. The coil component 1 is used in this filter circuit 100. In the first preferred embodiment, an explanation will be provided, where the filter circuit 100 is a third-order T-type LC filter circuit. However, a coil component configured similarly to the coil component 1 may be applied to a fifth-order T-type LC filter circuit or a higher-order T-type LC filter circuit, for example. As shown in FIG. 5, the filter circuit 100 includes a capacitor C1, electrodes 4a, 4b, and 4c, a coil L1 (first coil), and a coil L2 (second coil).

As shown in FIG. 5, one end of the capacitor C1 is connected to the electrode 4c, and the other end is connected to a GND line. The capacitor C1 may be, for example, a multilayer ceramic capacitor including $BaTiO_3$ (barium titanate) as a principal component, or may be a multilayer ceramic capacitor including another material as a principal component or another type of capacitor other than a multilayer ceramic capacitor, such as an aluminum electrolytic capacitor. The capacitor C1 includes an inductor L3 as parasitic inductance (equivalent series inductance (ESL)), and is equivalent to the circuit configuration in which the inductor L3 is connected in series with a capacitor C1a. The capacitor C1 may be equivalent to the circuit configuration in which a parasitic resistance (equivalent series resistance (ESR)) is connected in series with the inductor L3 and the capacitor C1a.

In addition to the capacitor C1, the coils L1 and L2 are connected to the electrode 4c. The coils L1 and L2 are magnetically coupled with each other and generate a negative inductance component. The negative inductance component can cancel out the parasitic inductance (inductor L3) of the capacitor C1 and make the inductance component of the capacitor C1 small. The filter circuit 100 including the capacitor C1 and the inductors L1 and L2 cancels out the parasitic inductance of the capacitor C1 by utilizing the negative inductance component generated by mutual inductance of the coils L1 and L2, thus improving the noise reduction effect in a high-frequency range.

The coil component 1 includes a ceramic multilayer body 3 (ceramic base body) including multiple substrates (ceramic green sheets) stacked on each other. Wiring patterns of coils are provided on the substrates, as shown in FIGS. 1 through 4. The multilayer body 3 includes a pair of main surfaces opposing each other and side surfaces connecting the main surfaces. In parallel with the main surfaces of the multilayer body 3, plural first wiring patterns 10, plural third wiring patterns 30, and plural second wiring patterns 20 are sequentially stacked on each other from the bottom so as to define the coils L1 and L2. Variations of magnetic coupling between the coils L1 and L2 can be controlled by the precision of the stacking misalignment between the first wiring patterns 10, the second wiring patterns 20, and the third wiring patterns 30.

In the coil component 1 of the first preferred embodiment, the wiring patterns are stacked on each other with a positional displacement, as shown in FIG. 3, so that the inductance values of the individual coils and the coupling coefficient between the coils are not significantly varied even with the occurrence of a stacking misalignment due to manufacturing variations. In FIG. 3, wiring patterns 30a through 30c are stacked on wiring patterns 10a through 10c and 20a through 20c with a positional displacement. The maximum displacement amount of the wiring patterns 30a through 30c from the wiring patterns 10a through 10c and 20a through 20c is a length D.

In the first preferred embodiment, at the designing stage of the coil component 1, the wiring patterns are stacked on each other with a positional displacement, as shown in FIG. 3. In the coil component 1 shown in FIG. 3, the wiring patterns 10a through 10c are stacked in alignment with each other, and the wiring patterns 30a through 30c are stacked on the wiring patterns 10a through 10c with a positional displacement. The wiring patterns 20a through 20c are stacked on the wiring patterns 30a through 30c with a positional displacement. In the coil component 1, the wiring patterns 20a through 20c are stacked in alignment with the wiring patterns 10a through 10c. That is, in the coil component 1, the wiring patterns of the same group (first wiring patterns 10, second wiring patterns 20, and third wiring patterns 30) are stacked in alignment with each other, and the wiring patterns of one group are stacked on those of another group with a positional displacement.

If, at the designing stage of the coil component, the wiring patterns are stacked on each other with a positional displacement, the inductance values of the individual coils and the coupling coefficient between the coils are less vulnerable to a stacking misalignment. This will be explained below. The inductance values of the individual coils and the coupling coefficient between the coils are determined by magnetic coupling between wiring patterns and are dependent on the distance between the wiring patterns.

If wiring patterns are stacked in alignment with each other, two wiring patterns are disposed in parallel or substantially in parallel with each other without the corresponding sides of the wiring patterns intersecting with each other as viewed from the direction of the main surfaces. In FIG. 3, the wiring patterns 10a and 10b, for example, are disposed in parallel or substantially in parallel with each other, and if a stacking misalignment occurs in the wiring patterns 10a and 10b in the X direction, the distance between the long side of the wiring pattern 10a and that of the wiring pattern 10b becomes longer, thus significantly varying magnetic coupling between the wiring patterns.

In contrast, if wiring patterns are stacked with a positional displacement, two wiring patterns are disposed to include an intersecting portion at which the corresponding sides of the two wiring patterns intersect with each other as viewed from the direction of the main surfaces. In FIG. 3, the wiring patterns 20c and 30a, for example, are disposed to include an intersecting portion. Even if a stacking misalignment occurs between the wiring patterns 20c and 30a in the X direction, only the positions of the long sides of the wiring patterns 20c and 30a and the intersecting portion thereof are changed, but the distance between the two wiring patterns is not considerably changed. This does not significantly influence magnetic coupling between the wiring patterns. Thus, as a result of stacking wiring patterns on each other with a positional displacement at the designing stage, that is, as a result of arranging wiring patterns to include an intersecting portion at the designing stage, the inductance values of the individual coils and the coupling coefficient between the coils of the coil component 1 are less vulnerable to a stacking misalignment. Capacitive coupling between wiring patterns is also dependent on the distance between the wiring patterns. Similarly, as a result of stacking wiring patterns on each other with a positional displacement at the designing stage, that is, as a result of arranging wiring patterns to include an intersecting portion at the designing stage, the value of capacitive coupling between the coils of the coil component 1 is also less vulnerable to a stacking misalignment.

Referring back to FIG. 1, the side surfaces of the multilayer body 3 include a first side surface (side surface on which the electrode 4a (first electrode) is provided) and a second side surface (side surface on which the electrode 4b (second electrode) is provided) on the long sides, and a third side surface (side surface on which the electrode 4c (third electrode) is provided) and a fourth side surface (side surface on which the electrode 4d is provided) on the short sides.

As shown in FIG. 2, in the coil component 1, the wiring patterns 10a through 10c (first wiring patterns 10), the wiring patterns 20a through 20c (second wiring patterns 20), and the wiring patterns 30a through 30c (third wiring patterns 30), which define the coils L1 and L2, are disposed inside the multilayer body 3. One portion of the wiring patterns 30a through 30c defines the coil L1, and the other portion thereof defines the coil L2. That is, the wiring patterns 30a through 30c define and function as a common portion of the coils L1 and L2. Providing the common portion, such as the third wiring patterns 30, can reduce variations of magnetic coupling between the coils L1 and L2. The coils L1 and L2 have a line-symmetrical or substantially line-symmetrical configuration with respect to the electrode 4c.

Among the first wiring patterns 10 disposed on the lower layers, an end portion 11 of the wiring pattern 10c on the bottommost layer is electrically connected to the electrode 4a. The other wiring patterns 10a and 10b are electrically connected to each other and to the wiring pattern 10c via the wiring pattern 10c and a via-conductor 51 (first via-conductor). The via-conductor 51 may include a single via-conductor or plural via-conductors. Among the plural first wiring patterns 10, at least one first wiring pattern (wiring pattern 10c, for example) is electrically connected to the electrode 4a. If the plural first wiring patterns 10 are all electrically connected to the electrode 4a, the provision of the via-conductor 51 to electrically connect all of the first wiring patterns 10 to each other is not necessary. However, if all of the first wiring patterns 10 are electrically connected to the electrode 4a, cracks are likely to occur during manufacturing. That is, if the end portion 11 is provided for each of the first wiring patterns 10 to electrically connect it to the electrode 4a, cracks are likely to occur when the plural first wiring patterns 10 are stacked and pressed with each other. If cracks are unlikely to occur during manufacturing, all of the first wiring patterns 10 may be electrically connected to the electrode 4a, thus omitting the via-conductor 51.

Considering the occurrence of cracks during manufacturing, the number of first wiring patterns 10 to be electrically connected to the electrode 4a is preferably smaller than the number of all of the first wiring patterns 10. More preferably, only one of the first wiring patterns 10 (wiring pattern 10c, for example) is electrically connected to the electrode 4a. If plural first wiring patterns 10 are connected to the electrode 4a, at least one layer including a first wiring pattern 10 which does not electrically connect to the electrode 4a may be interposed between one first wiring pattern 10 to electrically connect to the electrode 4a and another first wiring pattern 10 to electrically connect to the electrode 4a. More specifically, if the plural first wiring patterns 10 include the wiring patterns 10a through 10c, as shown in FIG. 2, the end portion 11 is provided for each of the wiring patterns 10a and 10c to electrically connect it to the electrode 4a, and the end portion 11 is not provided for the wiring pattern 10b.

Among the third wiring patterns 30 disposed on the intermediate layers, an end portion 31 of the wiring pattern 30c provided on the bottommost layer is electrically connected to the electrode 4c. The other wiring patterns 30a and 30b are electrically connected to each other and to the wiring pattern 30c via the wiring pattern 30c and a via-conductor 57 (seventh via-conductor). The via-conductor 57 may include a single via-conductor or plural via-conductors. Among the plural third wiring patterns 30, at least one third wiring pattern (wiring pattern 30c, for example) is electrically connected to the electrode 4c. If the plural third wiring patterns 30 are all electrically connected to the electrode 4c, the provision of the via-conductor 57 to electrically connect all of the third wiring patterns 30 to each other is not necessary. However, if all of the third wiring patterns 30 are electrically connected to the electrode 4c, cracks are likely to occur during manufacturing.

In terms of manufacturing, the number of third wiring patterns 30 to be electrically connected to the electrode 4c is preferably smaller than the number of all of the third wiring patterns 30. More preferably, only one of the third wiring patterns 30 (wiring pattern 30c, for example) is electrically connected to the electrode 4c. If plural third wiring patterns 30 are connected to the electrode 4c, at least one layer including a third wiring pattern 30 which does not electrically connect to the electrode 4c may be interposed between one third wiring pattern 30 to electrically connect to the electrode 4c and another third wiring pattern 30 to electrically connect to the electrode 4c. More specifically, if the plural third wiring patterns 30 include the wiring patterns 30a through 30c, as shown in FIG. 2, the end portion 31 is provided for each of the wiring patterns 30a and 30c to electrically connect it to the electrode 4c, and the end portion 31 is not provided for the wiring pattern 30b. If cracks are unlikely to occur during manufacturing, all of the third wiring patterns 30 may be electrically connected to the electrode 4c, thus omitting the via-conductor 57.

The third wiring patterns 30 disposed on the intermediate layers are electrically connected to the first wiring patterns 10 disposed on the lower layers by via-conductors 52 and 53. Each of the via-conductors 52 and 53 may include a single via-conductor or plural via-conductors. The via-conductors 52 and 53 are each electrically connected to the wiring patterns 10a through 10c of the first wiring patterns 10 and the wiring patterns 30a through 30c of the third wiring patterns 30. A portion of each of the first wiring patterns 10 receiving the via-conductor 52 (second via-conductor) and a portion of each of the first wiring patterns 10 receiving the via-conductor 53 (third via-conductor) face different side surfaces of the multilayer body 3. More specifically, as shown in FIG. 4, portions of the first wiring patterns 10 receiving the via-conductor 52 (connecting portions 52g through 52i connecting to the via-conductor 52 are shown in FIG. 4) face the first side surface on the long side, while portions of the first wiring patterns 10 receiving the via-conductor 53 (connecting portions 53g through 53i connecting to the via-conductor 53 are shown in FIG. 4) face the fourth side surface on the short side. In this manner, the portions of the first wiring patterns 10 receiving the via-conductor 52 and those receiving the via-conductor 53 face the different side surfaces.

Figure 6:
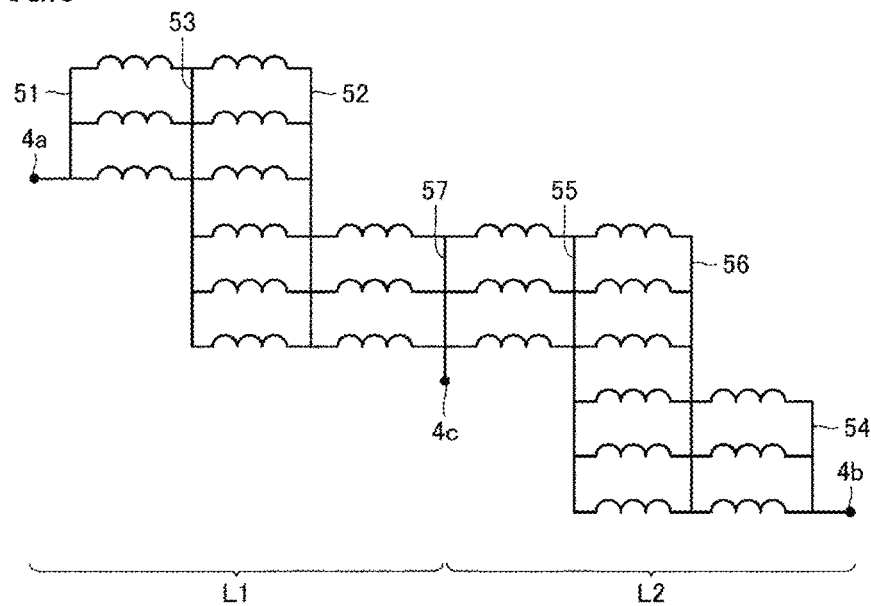
FIG. 6 is an equivalent circuit diagram of the coil component according to the first preferred embodiment of the present invention.

That is, the via-conductors 52 and 53 are provided over one corner of the first wiring patterns 10. Between the via-conductors 51 and 53, the three wiring patterns 10a through 10c are partially connected in parallel with each other, namely, three inductors are connected in parallel with each other. Between the via-conductors 52 and 53, the three wiring patterns 10a through 10c are also partially connected in parallel with each other, namely, three inductors are connected in parallel with each other. The via-conductors 52 and 53 are also provided in the wiring patterns 30a through 30c of the third wiring patterns 30. Accordingly, between the via-conductors 52 and 53, the three wiring patterns 30a through 30c are partially connected in parallel with each other, namely, three inductors are connected in parallel with each other. As a result, a total of six inductors including the three inductors in the wiring patterns 10a through 10c and those in the wiring patterns 30a through 30c are connected in parallel with each other. FIG. 6 is an equivalent circuit diagram of the coil component according to the first preferred embodiment. As shown in FIG. 6, the coil L1 includes the parallel-connected three inductors between the via-conductors 51 and 53, the parallel-connected six inductors between the via-conductors 52 and 53, and the parallel-connected three inductors between the via-conductors 52 and 57. With this configuration, wiring between the via-conductors 52 and 53 and that between via-conductors 55 and 56 are doubled so as to reduce the resistance and accordingly to reduced or prevent heat generation.

The inductance of the six inductors between the via-conductors 52 and 53 can be adjusted by the distance between the via-conductors 52 and 53. In particular, the distance between the position at which the via-conductor 52 is provided and that at which the via-conductor 53 is provided can be adjusted within a length shorter than the total length of one half of the length of the fourth side surface (one side surface) on the short side of the multilayer body 3 and the length of the first side surface (another side surface perpendicular to the above-described side surface) on the long side of the multilayer body 3. Adjusting the inductance of the parallel-connected six inductors of the coil L1 can suitably control mutual inductance of the two coils L1 and L2.

Among the second wiring patterns 20 disposed on the upper layers, an end portion 21 of the wiring pattern 20c provided on the bottommost layer is electrically connected to the electrode 4b. The other wiring patterns 20a and 20b are electrically connected to each other and to the wiring pattern 20c via the wiring pattern 20c and a via-conductor 54 (fourth via-conductor). The via-conductor 54 may include a single via-conductor or plural via-conductors. Among the plural second wiring patterns 20, at least one second wiring pattern (wiring pattern 20c, for example) is electrically connected to the electrode 4b. If the plural second wiring patterns 20 are all electrically connected to the electrode 4b, the provision of the via-conductor 54 to electrically connect all of the second wiring patterns 20 to each other is not necessary. However, if all of the second wiring patterns 20 are electrically connected to the electrode 4b, cracks are likely to occur during manufacturing. That is, if the end portion 21 is provided for each of the second wiring patterns 20 to electrically connect it to the electrode 4b, cracks are likely to occur when the plural second wiring patterns 20 are stacked and pressed with each other. If cracks are unlikely to occur during manufacturing, all of the second wiring patterns 20 may be electrically connected to the electrode 4b, thus omitting the via-conductor 54.

Considering the occurrence of cracks during manufacturing, the number of second wiring patterns 20 to be electrically connected to the electrode 4b is preferably smaller than the number of all of the second wiring patterns 20. More preferably, only one of the second wiring patterns 20 (wiring pattern 20c, for example) is electrically connected to the electrode 4b. If plural second wiring patterns 20 connect to the electrode 4b, at least one layer including a second wiring pattern 20 which does not electrically connect to the electrode 4b may be interposed between one second wiring pattern 20 to electrically connect to the electrode 4b and another second wiring pattern 20 to electrically connect to the electrode 4b. More specifically, if the plural second wiring patterns 20 include the wiring patterns 20a through 20c, as shown in FIG. 2, the end portion 21 is provided for each of the wiring patterns 20a and 20c to electrically connect it to the electrode 4b, and the end portion 21 is not provided for the wiring pattern 20b.

The second wiring patterns 20 disposed on the upper layers are electrically connected to the third wiring patterns 30 disposed on the intermediate layers by the via-conductors 55 and 56. Each of the via-conductors 55 and 56 may include a single via-conductor or plural via-conductors. The via-conductors 55 and 56 are each electrically connected to the wiring patterns 20a through 20c of the second wiring patterns 20 and the wiring patterns 30a through 30c of the third wiring patterns 30. A portion of each of the second wiring patterns 20 receiving the via-conductor 55 (fifth via-conductor) and a portion of each of the second wiring patterns 20 receiving the via-conductor 56 (sixth via-conductor) face different side surfaces of the multilayer body 3. More specifically, as shown in FIG. 4, portions of the second wiring patterns 20 receiving the via-conductor 55 (connecting portions 55a through 55c connecting to the via-conductor 55 are shown in FIG. 4) face the second side surface on the long side, while portions of the second wiring patterns 20 receiving the via-conductor 56 (connecting portions 56a through 56c connecting to the via-conductor 56 are shown in FIG. 4) face the fourth side surface on the short side. In this manner, the portions of the second wiring patterns 20 receiving the via-conductor 55 and those receiving the via-conductor 56 face the different side surfaces.

That is, the via-conductors 55 and 56 are provided over one corner of the second wiring patterns 20. Between the via-conductors 54 and 56, the three wiring patterns 20a through 20c are partially connected in parallel with each other, namely, three inductors are connected in parallel with each other. Between the via-conductors 55 and 56, the three wiring patterns 20a through 20c are also partially connected in parallel with each other, namely, three inductors are connected in parallel with each other. The via-conductors 55 and 56 are also provided in the wiring patterns 30a through 30c of the third wiring patterns 30. Accordingly, between the via-conductors 55 and 56, the three wiring patterns 30a through 30c are partially connected in parallel with each other, namely, three inductors are connected in parallel with each other. As a result, a total of six inductors including the three inductors in the wiring patterns 20a through 20c and those in the wiring patterns 30a through 30c are connected in parallel with each other. As shown in FIG. 6, the coil L2 includes the parallel-connected three inductors between the via-conductors 54 and 56, the parallel-connected six inductors between the via-conductors 55 and 56, and the parallel-connected three inductors between the via-conductors 55 and 57.

The inductance of the six inductors between the via-conductors 55 and 56 can be adjusted by the distance between the via-conductors 55 and 56. In particular, the distance between the position at which the via-conductor 55 is provided and that at which the via-conductor 56 is provided can be adjusted within a length shorter than the total length of one half of the length of the fourth side surface (one side surface) on the short side of the multilayer body 3 and the length of the second side surface (another side surface perpendicular to the above-described side surface) on the long side of the multilayer body 3. Adjusting the inductance of the parallel-connected six inductors of the coil L2 can suitably control mutual inductance of the two coils L1 and L2.

As shown in FIG. 4, each of the first wiring patterns 10, the second wiring patterns 20, and the third wiring patterns 30 is formed by, for example, applying a conductive paste (for example, Ni paste) to a corresponding one of ceramic green sheets 3a through 3i, which are substrates, by screen printing. On the ceramic green sheet 3a, the wiring pattern 20a is formed. The wiring pattern 20a is formed to rotate through one revolution counterclockwise in FIG. 4 starting from a portion near the middle of the bottom long side of the ceramic green sheet 3a to extend along the individual sides in FIG. 4. A gap is formed between the leading end and the trailing end of the wiring pattern 20a. In the wiring pattern 20a, a connecting portion 54a to connect to the via-conductor 54 is provided at the leading end, a connecting portion 56a to connect to the via-conductor 56 is provided on the left short side in FIG. 4, and a connecting portion 55a to connect to the via-conductor 55 is provided at the trailing end. Additionally, the wiring pattern 20a has been rotated and shifted clockwise with respect to the position of the ceramic green sheet 3a so that the long sides of the wiring pattern 20a tilt at, for example, about 5 degrees with respect to the long sides of the ceramic green sheet 3a.

On the ceramic green sheet 3b, the wiring pattern 20b is formed. The configuration of the wiring pattern 20b is the same or substantially the same as the wiring pattern 20a formed on the ceramic green sheet 3a. The wiring pattern 20b has been rotated and shifted clockwise with respect to the position of the ceramic green sheet 3b. In the wiring pattern 20b, a connecting portion 54b to connect to the via-conductor 54 is provided at the leading end, a connecting portion 56b to connect to the via-conductor 56 is provided on the left short side in FIG. 4, and a connecting portion 55b to connect to the via-conductor 55 is provided at the trailing end.

On the ceramic green sheet 3c, the wiring pattern 20c is formed. The wiring pattern 20c is formed to rotate through one revolution counterclockwise in FIG. 4 starting from a portion near the middle of the bottom long side of the ceramic green sheet 3c to extend along the individual sides in FIG. 4. A gap is formed between the leading end and the trailing end of the wiring pattern 20c. At the leading end of the wiring pattern 20c, the end portion 21 to connect to the electrode 4b is formed. In the wiring pattern 20c, a connecting portion 54c to connect to the via-conductor 54 is provided at the leading end, a connecting portion 56c to connect to the via-conductor 56 is provided on the left short side in FIG. 4, and a connecting portion 55c to connect to the via-conductor 55 is provided at the trailing end. Additionally, the wiring pattern 20c has been rotated and shifted clockwise with respect to the position of the ceramic green sheet 3c so that the long sides of the wiring pattern 20c tilt at, for example, about 5 degrees with respect to the long sides of the ceramic green sheet 3c.

By stacking the three ceramic green sheets 3a through 3c, the second wiring patterns 20 shown in FIG. 1 are formed.

On the ceramic green sheet 3d, the wiring pattern 30a is formed. The wiring pattern 30a is formed to rotate through one revolution counterclockwise in FIG. 4 starting from a portion near the middle of the left short side of the ceramic green sheet 3d to extend along the individual sides in FIG. 4. A gap is formed between the leading end and the trailing end of the wiring pattern 30a. In the wiring pattern 30a, a connecting portion 56d to connect to the via-conductor 56 is provided at the leading end, a connecting portion 55d to connect to the via-conductor 55 is provided on the bottom long side in FIG. 4, a connecting portion 57a to connect to the via-conductor 57 is provided on the right short side in FIG. 4, a connecting portion 52d to connect to the via-conductor 52 is provided on the top long side in FIG. 4, and a connecting portion 53d to connect to the via-conductor 53 is provided at the trailing end. Additionally, the wiring pattern 30a has been rotated and shifted counterclockwise with respect to the position of the ceramic green sheet 3d so that the long sides of the wiring pattern 30a tilt at, for example, about −5 degrees with respect to the long sides of the ceramic green sheet 3d.

On the ceramic green sheet 3e, the wiring pattern 30b is formed. The configuration of the wiring pattern 30b is the same or substantially the same as the wiring pattern 30a formed on the ceramic green sheet 3d. The wiring pattern 30b has been rotated and shifted counterclockwise with respect to the position of the ceramic green sheet 3e. In the wiring pattern 30b, a connecting portion 56e to connect to the via-conductor 56 is provided at the leading end, a connecting portion 55e to connect to the via-conductor 55 is provided on the bottom long side in FIG. 4, a connecting portion 57b to connect to the via-conductor 57 is provided on the right short side in FIG. 4, a connecting portion 52e to connect to the via-conductor 52 is provided on the top long side in FIG. 4, and a connecting portion 53e to connect to the via-conductor 53 is provided at the trailing end.

On the ceramic green sheet 3f, the wiring pattern 30c is formed. The wiring pattern 30c is formed to rotate through one revolution counterclockwise in FIG. 4 starting from a portion near the middle of the left short side of the ceramic green sheet 3f to extend along the individual sides in FIG. 4. A gap is formed between the leading end and the trailing end of the wiring pattern 30c. In a middle portion of the right short side of the wiring pattern 30c in FIG. 4, the end portion 31 to connect to the electrode 4c is formed. In the wiring pattern 30c, a connecting portion 56f to connect to the via-conductor 56 is provided at the leading end, a connecting portion 55f to connect to the via-conductor 55 is provided on the bottom long side in FIG. 4, a connecting portion 57c to connect to the via-conductor 57 is provided on the right short side in FIG. 4, a connecting portion 52f to connect to the via-conductor 52 is provided on the top long side in FIG. 4, and a connecting portion 53f to connect to the via-conductor 53 is provided at the trailing end. Additionally, the wiring pattern 30c has been rotated and shifted counterclockwise with respect to the position of the ceramic green sheet 3f so that the long sides of the wiring pattern 30c tilt at, for example, about −5 degrees with respect to the long sides of the ceramic green sheet 3f.

By stacking the three ceramic green sheets 3d through 3f, the third wiring patterns 30 shown in FIG. 1 are formed.

On the ceramic green sheet 3g, the wiring pattern 10a is formed. The wiring pattern 10a is formed to rotate through one revolution clockwise in FIG. 4 starting from a portion near the middle of the top long side of the ceramic green sheet 3g to extend along the individual sides in FIG. 4. A gap is formed between the leading end and the trailing end of the wiring pattern 10a. In the wiring pattern 10a, a connecting portion 51a to connect to the via-conductor 51 is provided at the leading end, a connecting portion 53g to connect to the via-conductor 53 is provided on the left short side in FIG. 4, and a connecting portion 52g to connect to the via-conductor 52 is provided at the trailing end. Additionally, the wiring pattern 10a has been rotated and shifted clockwise with respect to the position of the ceramic green sheet 3g so that the long sides of the wiring pattern 10a tilt at, for example, about 5 degrees with respect to the long sides of the ceramic green sheet 3g.

On the ceramic green sheet 3h, the wiring pattern 10b is formed. The configuration of the wiring pattern 10b is the same or substantially the same as the wiring pattern 10a formed on the ceramic green sheet 3g. The wiring pattern 10b has been rotated and shifted clockwise with respect to the position of the ceramic green sheet 3h. In the wiring pattern 10b, a connecting portion 51b to connect to the via-conductor 51 is provided at the leading end, a connecting portion 53h to connect to the via-conductor 53 is provided on the left short side in FIG. 4, and a connecting portion 52h to connect to the via-conductor 52 is provided at the trailing end.

On the ceramic green sheet 3i, the wiring pattern 10c is formed. The wiring pattern 10c is formed to rotate through one revolution clockwise in FIG. 4 starting from a portion near the middle of the top long side of the ceramic green sheet 3i to extend along the individual sides in FIG. 4. A gap is formed between the leading end and the trailing end of the wiring pattern 10c. At the leading end of the wiring pattern 10c, the end portion 11 to connect to the electrode 4a is formed. In the wiring pattern 10c, a connecting portion 51c to connect to the via-conductor 51 is provided at the leading end, a connecting portion 53i to connect to the via-conductor 53 is provided on the left short side in FIG. 4, and a connecting portion 52i to connect to the via-conductor 52 is provided at the trailing end. Additionally, the wiring pattern 10c has been rotated and shifted clockwise with respect to the position of the ceramic green sheet 3i so that the long sides of the wiring pattern 10c tilt at, for example, about 5 degrees with respect to the long sides of the ceramic green sheet 3i.

By stacking the three ceramic green sheets 3g through 3i, the first wiring patterns 10 shown in FIG. 1 are formed.

In the coil component 1, the plural ceramic green sheets 3a through 3i shown in FIG. 4, each of which includes at least one corresponding sheet, are stacked on each other, and plural ceramic green sheets (dummy layers) without wiring patterns printed thereon are stacked on top and bottom surfaces of the stacked ceramic green sheets 3a through 3i. The multiple ceramic green sheets including the dummy layers are pressure-bonded to each other, thus forming the multilayer body 3 (ceramic base body) which is not yet fired. Then, the formed multilayer body 3 is fired, and copper electrodes are burned onto the exterior of the fired multilayer body 3 so that they are electrically connected to the wiring patterns, thus forming the electrodes 4a through 4d.

In the coil component 1, multiple ceramic green sheets on which the first wiring patterns 10, the second wiring patterns 20, and the third wiring patterns 30 of the coils L1 and L2 are formed are stacked on each other. Because of this configuration, in the coil component 1, the first wiring patterns 10 and the third wiring patterns 30 are disposed to include an intersecting portion where the corresponding sides of the wiring patterns intersect with each other as viewed from the direction of the main surfaces. The first wiring patterns 10 are rotated to tilt at, for example, about 5 degrees with respect to the long sides of the multilayer body 3, while the third wiring patterns 30 are rotated to tilt at, for example, about −5 degrees with respect to the long sides of the multilayer body 3. The angle (acute angle, hereinafter the angle means an acute angle) at which the first wiring patterns 10 and the third wiring patterns 30 intersect with each other is thus, for example, about 10 degrees. Similarly, in the coil component 1, the second wiring patterns 20 and the third wiring patterns 30 are disposed to include an intersecting portion where the corresponding sides of the wiring patterns intersect with each other as viewed from the direction of the main surfaces. The second wiring patterns 20 are rotated to tilt at, for example, about 5 degrees with respect to the long sides of the multilayer body 3, while the third wiring patterns 30 are rotated to tilt at, for example, about −5 degrees with respect to the long sides of the multilayer body 3. The angle at which the second wiring patterns 20 and the third wiring patterns 30 intersect with each other is thus, for example, about 10 degrees. With this configuration, in the coil component 1, variations of magnetic coupling between the first wiring patterns 10 and the third wiring patterns 30 and that between the second wiring patterns 20 and the third wiring patterns 30 caused by a stacking misalignment can be reduced.

As discussed above, the coil component 1 is formed by stacking wiring patterns, which are a metal member, and multiple ceramic green sheets, which are a ceramic member, and pressing them each other. The ductility of the metal member and that of the ceramic member are different, and the multilayer body 3 may crack due to the difference in the compressibility therebetween when the metal member and the ceramic member are pressed with each other. As discussed above, in the coil component 1, after the ceramic green sheets are pressure-bonded with each other, the resulting multilayer body 3 is fired. The multilayer body 3 may crack during firing due to the difference in the thermal shrinkage rate between the metal member and the ceramic member.

To address these issues, in the coil component 1 according to the first preferred embodiment, in order to reduce or prevent the occurrence of cracks during manufacturing, the number of first wiring patterns 10 to be provided with the end portion 11 which connects a first wiring pattern 10 to the electrode 4a is reduced. Similarly, in the coil component 1, the number of second wiring patterns 20 to be provided with the end portion 21 which connects a second wiring pattern 20 to the electrode 4b may be reduced, or the number of third wiring patterns 30 to be provided with the end portion 31 which connects a third wiring pattern 30 to the electrode 4c may be reduced.

Figure 7A:
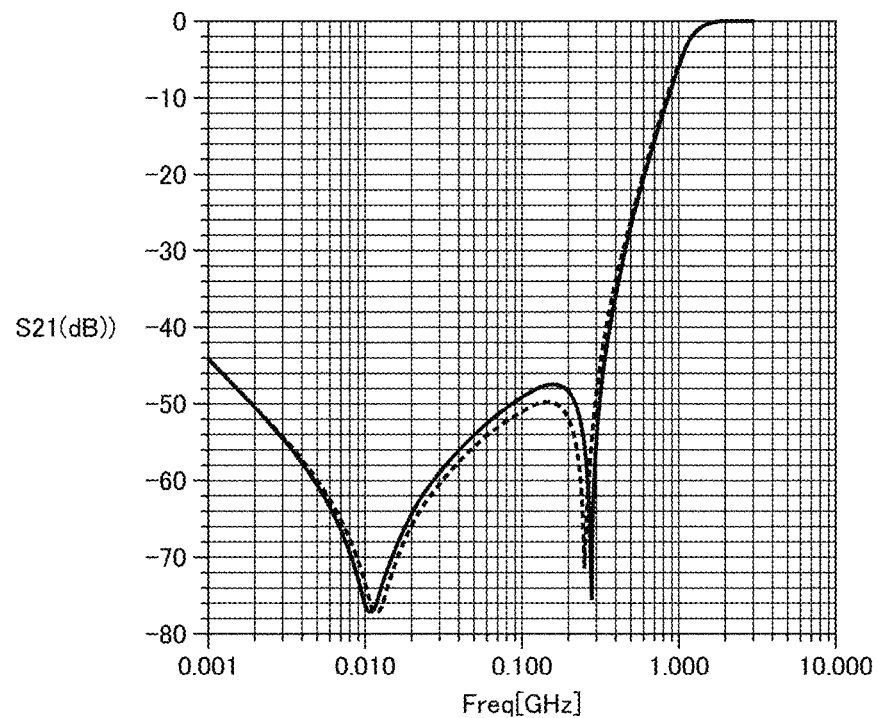
FIGS. 7A and 7B show graphs illustrating the transmission characteristics of filter circuits including a coil component in response to the frequency.
Figure 7B:
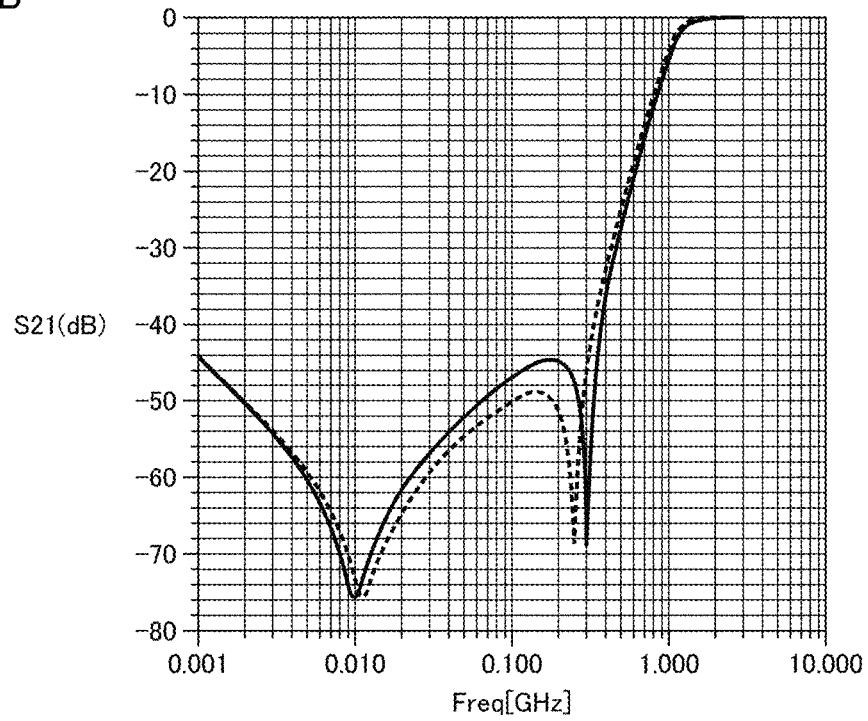

FIGS. 7A and 7B show graphs illustrating the transmission characteristics of filter circuits including a coil component in response to the frequency. The graph of FIG. 7A illustrates a simulation result of the transmission characteristics in response to the frequency obtained by conducting circuit simulation for a filter circuit including the coil component 1. In this coil component 1, wiring patterns are disposed to include an intersecting portion as viewed from the direction of the main surfaces, as shown in FIG. 3. The angle between two groups of wiring patterns is, for example, about 10 degrees. The graph of FIG. 7B illustrates a simulation result of the transmission characteristics in response to the frequency obtained by conducting circuit simulation for a filter circuit including a coil component. In this coil component, wiring patterns are not disposed to include an intersecting portion as viewed from the direction of the main surfaces. In the graphs of FIGS. 7A and 7B, the horizontal axis indicates the frequency Freq (GHz), while the vertical axis indicates the transmission characteristics S21 (dB).

In the graphs of FIGS. 7A and 7B, the simulation result of the transmission characteristics without a stacking misalignment is indicated by the broken line. In the graphs of FIGS. 7A and 7B, the simulation result of the transmission characteristics with a stacking misalignment is indicated by the solid line. In this case, it is assumed that a stacking misalignment of about 30 μm has occurred in the third wiring patterns 30 with respect to the first and second wiring patterns 10 and 20 in the X direction. The graphs of FIGS. 7A and 7B show that, in a range of about 0.010 GHz to about 0.400 GHz, the transmission characteristics of the filter circuit including the coil component 1 are less vulnerable to the stacking misalignment than those of the filter circuit having a different coil component. The transmission characteristics in the range of about 0.010 GHz to about 0.400 GHz are those in a range where a negative inductance component generated by the coils L1 and L2 cancels out the parasitic inductance of the capacitor C1. As seen in FIG. 7A, in the filter circuit including the coil component 1, the occurrence of a stacking misalignment does not considerably influence magnetic coupling between the coils L1 and L2.

As described above, the coil component 1 according to the first preferred embodiment is a coil component in which the coils L1 and L2 are magnetically coupled with each other, in other words, a first coil and a second coil are magnetically coupled with each other. The coil component 1 includes a multilayer body 3, at least one first wiring pattern 10, and at least one second wiring pattern 20. The multilayer body 3 includes multiple ceramic layers stacked on each other, a pair of main surfaces opposing each other, and side surfaces connecting the main surfaces. The at least one first wiring pattern 10 is stacked inside the multilayer body 3 and defines at least a portion of the coil L1. The at least one second wiring pattern 20 is stacked on the top layer of the first wiring pattern 10 and defines at least a portion of the coil L2. The shape of each of the first and second wiring patterns 10 and 20 is rectangular or substantially rectangular. At least one of the coils L1 and L2 includes at least one combination of wiring patterns that are stacked on each other with a positional displacement so as to include an intersecting portion where corresponding sides of the wiring patterns intersect with each other as viewed from the direction of the main surfaces.

In this manner, in the coil component 1 according to the first preferred embodiment, at least one of the coils L1 and L2 includes at least one combination of wiring patterns that are stacked on each other with a positional displacement so as to include an intersecting portion where corresponding sides of the wiring patterns intersect with each other as viewed from the direction of the main surfaces. With this configuration, even with the occurrence of a stacking misalignment between layers of wiring patterns, variations of the value of mutual inductance M can be reduced. It is thus possible to manufacture the coil component 1 so that mutual inductance M can be maintained at a constant or substantially constant value.

The coil component 1 may further include at least one third wiring pattern 30 which is disposed between the first wiring pattern 10 and the second wiring pattern 20 and which includes a portion defining a portion of the coil L1 and a portion defining a portion of the coil L2. With this configuration, in the coil component 1 according to the first preferred embodiment, the coils L1 and L2 can be magnetically coupled with each other via the third wiring pattern 30, so that the value of mutual inductance M can be increased. The third wiring pattern 30 is provided in the coil component 1 according to the first preferred embodiment. However, the coils L1 and L2 may include the first and second wiring patterns 10 and 20 without providing the third wiring pattern 30.

A combination of the first wiring pattern 10 and the third wiring pattern 30 that are stacked on each other with a positional displacement so as to include an intersecting portion is preferably included. In the coil component 1 according to the first preferred embodiment, the wiring pattern 10a and the wiring pattern 30c include an intersecting portion, as shown in FIG. 3. With this configuration, even with the occurrence of a stacking misalignment between layers of wiring patterns, variations of the value of mutual inductance M can be reduced. It is thus possible to manufacture the coil component 1 so that mutual inductance M can be maintained at a constant or substantially constant value.

A combination of the second wiring pattern 20 and the third wiring pattern 30 that are stacked on each other with a positional displacement so as to include an intersecting portion is preferably included. In the coil component 1 according to the first preferred embodiment, the wiring pattern 20c and the wiring pattern 30a include an intersecting portion, as shown in FIG. 3. With this configuration, even with the occurrence of a stacking misalignment between layers of wiring patterns, variations of the value of mutual inductance M can be reduced. It is thus possible to manufacture the coil component 1 so that mutual inductance M can be maintained at a constant or substantially constant value.

The coil L1 further includes a portion including plural wiring patterns connected in parallel with each other which are provided by electrically connecting the plural first wiring patterns 10 with each other using the via-conductor 51. The coil L1 further includes a portion including plural wiring patterns connected in parallel with each other which are provided by electrically connecting the plural first wiring patterns 10 with each other and the plural third wiring patterns 30 with each other using the via-conductors 52 and 53 which pass through the plural first and third wiring patterns 10 and 30. The coil L2 further includes a portion including plural wiring patterns connected in parallel with each other which are provided by electrically connecting the plural second wiring patterns 20 with each other using the via-conductor 54. The coil L2 further includes a portion including plural wiring patterns connected in parallel with each other which are provided by electrically connecting the plural second wiring patterns 20 with each other and the plural third wiring patterns 30 with each other using the via-conductors 55 and 56 which pass through the plural second and third wiring patterns 20 and 30. The multilayer body 3 preferably includes an electrode 4a electrically connected to the first wiring pattern 10, an electrode 4b electrically connected to the second wiring pattern 20, and an electrode 4c electrically connected to the third wiring pattern 30 which is connected to plural wiring patterns connected with each other using the via-conductor 57.

In the coil component 1 according to the first preferred embodiment, the plural first wiring patterns 10 and the plural third wiring patterns 30 are electrically connected with each other using the via-conductors 52 and 53, while the plural second wiring patterns 20 and the plural third wiring patterns 30 are electrically connected with each other using the via-conductors 55 and 56. Arranging the wiring patterns of the coils in this manner can regulate the concentration of a current and suitably adjust mutual inductance of the two coils. Parallel-connected inductors are provided in multiple locations, thus reducing or preventing heat generation of the coils L1 and L2.

In the coil component 1, a portion of the first wiring pattern 10 receiving the via-conductor 52 and a portion of the first wiring pattern 10 receiving the via-conductor 53 may face different side surfaces of the multilayer body 3, while a portion of the second wiring pattern 20 receiving the via-conductor 55 and a portion of the second wiring pattern 20 receiving the via-conductor 56 may face different side surfaces of the multilayer body 3. This configuration of the coil component 1 makes it possible to regulate the concentration of a current at a corner of the first wiring pattern 10 or the second wiring pattern 20.

The filter circuit 100 includes the above-described coil component 1 and a capacitor C1 connected to one end of each of the plural coils L1 and L2 (electrode 4c between the coils L1 and L2) that are magnetically coupled with each other in the coil component 1. With this configuration, the filter circuit 100 can suitably adjust mutual inductance of the two coils included in the coil component 1 so as to cancel out parasitic inductance. Even with the occurrence of a stacking misalignment between layers of wiring patterns, variations of the value of mutual inductance M can be reduced. It is thus possible to manufacture the filter circuit 100 so that mutual inductance M can be maintained at a constant or substantially constant value.

Second Preferred Embodiment

In the first preferred embodiment, the wiring patterns of the same group (wiring patterns 10a through 10c of the first wiring patterns 10, for example) are stacked in alignment with each other, while a wiring pattern of one group and that of another group (wiring patterns 10a and 20c, for example) are stacked on each other with a positional displacement. That is, in the coil component 1, as shown in FIG. 3, the wiring patterns 10a and 30c include an intersecting portion, while the wiring patterns 20c and 30a include an intersecting portion. However, a coil component is not limited to this configuration. The wiring patterns of the same group (wiring patterns 10a through 10c of the first wiring patterns 10, for example) may be stacked on each other with a positional displacement. In a second preferred embodiment of the present invention, a configuration in which individual wiring patterns are stacked on each other with a positional displacement will be discussed below.

Figure 8:
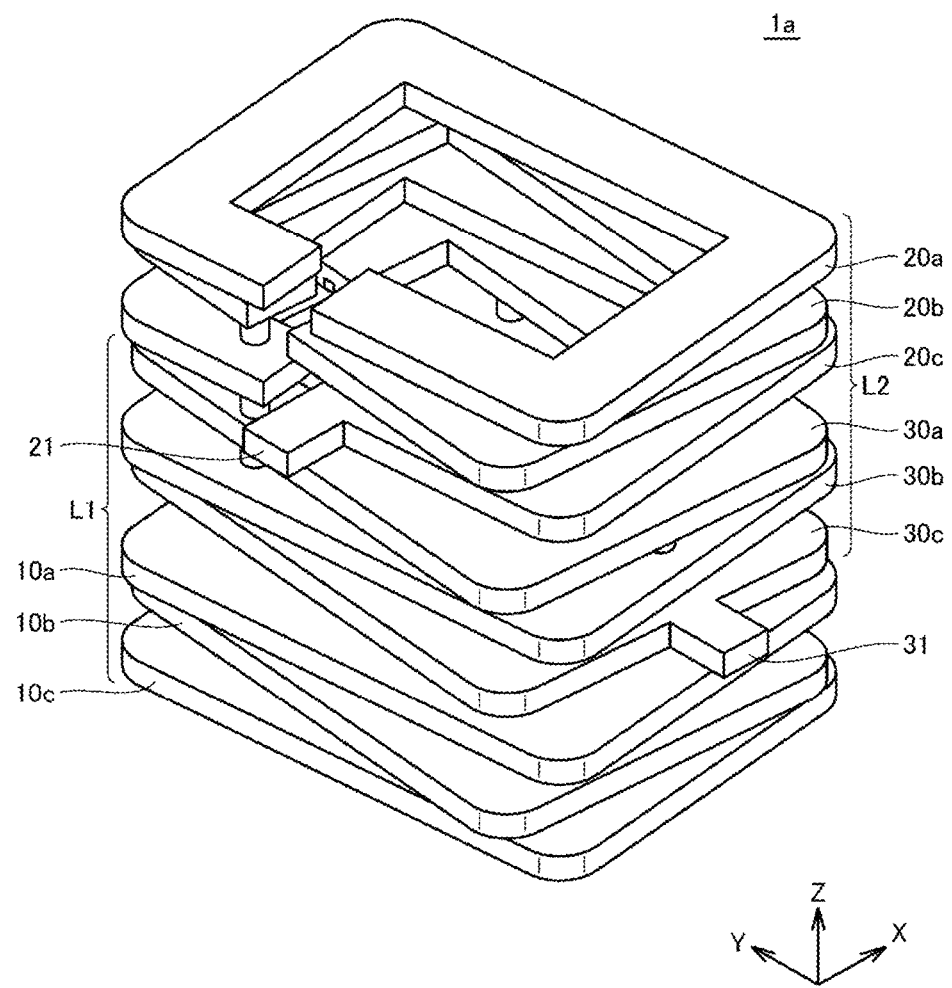
FIG. 8 is a perspective view illustrating a positional displacement between wiring patterns of a coil component according to a second preferred embodiment of the present invention.

FIG. 8 is a perspective view illustrating a positional displacement between wiring patterns of a coil component according to the second preferred embodiment. The configuration of a coil component 1a shown in FIG. 8 is the same or substantially the same as the coil component 1, except that the wiring patterns are displaced from each other in a different manner from the coil component 1. The same or corresponding elements as those of the coil component 1 are designated by the same reference numerals and a detailed explanation thereof will not be repeated. In the coil component 1a of the second preferred embodiment, the individual wiring patterns are stacked on each other with a positional displacement as shown in FIG. 8, so that the inductance values of individual coils and the coupling coefficient between the coils are not significantly varied even with the occurrence of a stacking misalignment due to manufacturing variations. That is, in the second preferred embodiment, at the designing stage of the coil component 1a, wiring patterns are displaced from each other layer by layer, as shown in FIG. 8.

In the coil component 1a shown in FIG. 8, the wiring patterns 10a through 10c (first wiring patterns 10) are stacked on each other so that they are individually displaced from each other, and the wiring pattern 30c is stacked on the wiring pattern 10a with a positional displacement. In the coil component 1a, the wiring patterns 30a through 30c (third wiring patterns 30) are stacked so that they are individually displaced from each other, and the wiring pattern 20c is stacked on the wiring pattern 30a with a positional displacement. In the coil component 1a, the wiring patterns 20a through 20c (second wiring patterns 20), as well as the first and third wiring patterns 10 and 30, are stacked so that they are individually displaced from each other. That is, in the coil component 1a, the wiring patterns of the same group (wiring patterns 10a through 10c of the first wiring patterns 10, for example) are stacked so that they are individually displaced from each other and so that they are also displaced from a different group of wiring patterns.

Figure 9:
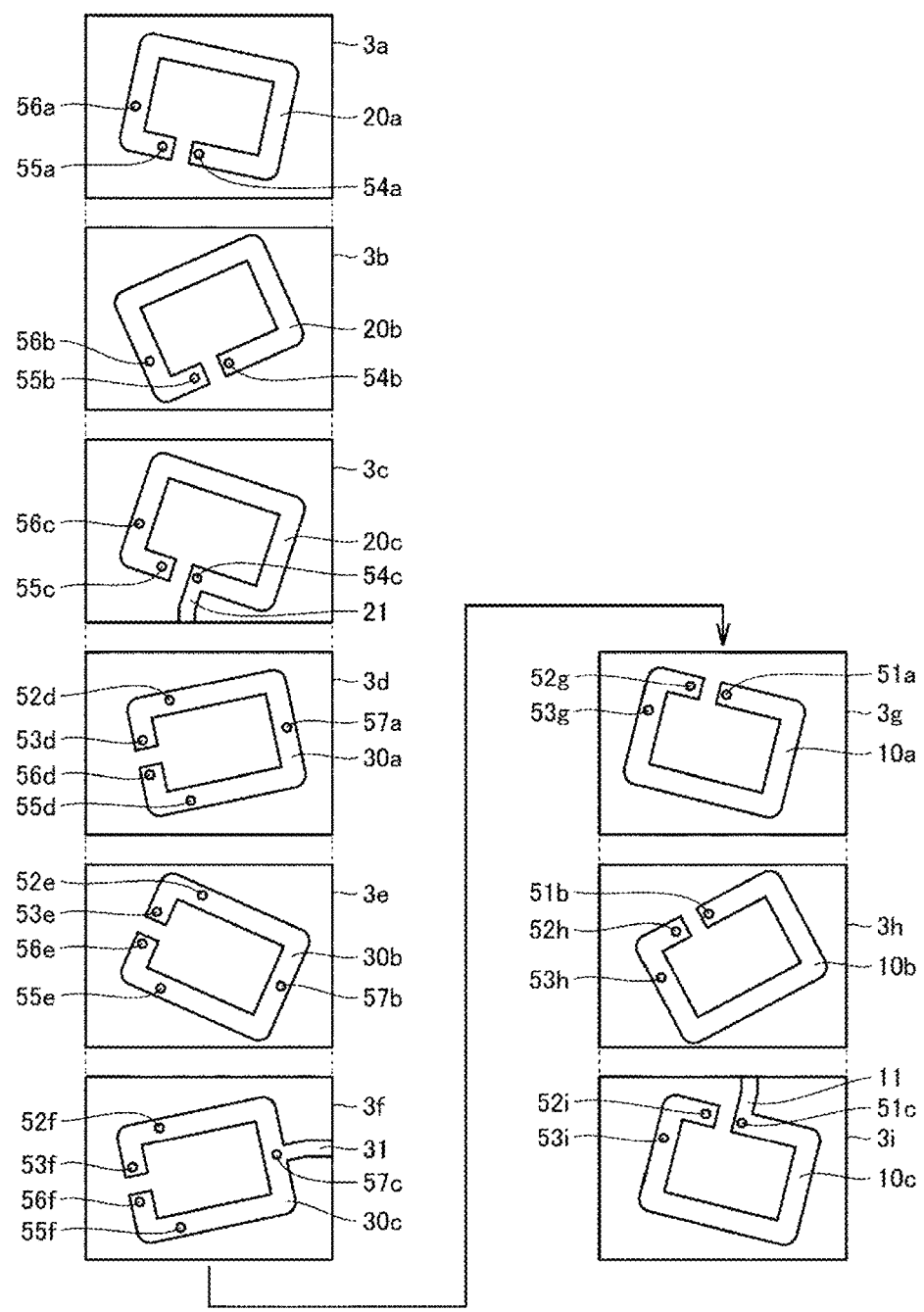
FIG. 9 is an exploded plan view illustrating the configuration of the coil component according to the second preferred embodiment of the present invention.

FIG. 9 is an exploded plan view illustrating the configuration of the coil component 1a according to the second preferred embodiment. As shown in FIG. 9, each of the first wiring patterns 10, the second wiring patterns 20, and the third wiring patterns 30 is formed, for example, by applying a conductive paste (for example, Ni paste) to a corresponding one of ceramic green sheets 3a through 3i, which are substrates, by screen printing. On the ceramic green sheet 3a, the wiring pattern 20a is formed. The wiring pattern 20a is formed to rotate through one revolution counterclockwise in FIG. 9 starting from a portion near the middle of the bottom long side of the ceramic green sheet 3a to extend along the individual sides in FIG. 9. A gap is formed between the leading end and the trailing end of the wiring pattern 20a. In the wiring pattern 20a, a connecting portion 54a to connect to the via-conductor 54 is provided at the leading end, a connecting portion 56a to connect to the via-conductor 56 is provided on the left short side in FIG. 9, and a connecting portion 55a to connect to the via-conductor 55 is provided at the trailing end. Additionally, the wiring pattern 20a has been rotated and shifted clockwise with respect to the position of the ceramic green sheet 3a so that the long sides of the wiring pattern 20a tilt at, for example, about 5 degrees with respect to the long sides of the ceramic green sheet 3a.

On the ceramic green sheet 3b, the wiring pattern 20b is formed. The configuration of the wiring pattern 20b is the same or substantially the same as the wiring pattern 20a formed on the ceramic green sheet 3a. The wiring pattern 20b has been rotated and shifted counterclockwise with respect to the position of the ceramic green sheet 3b. That is, the wiring pattern 20b has been rotated and shifted counterclockwise with respect to the position of the ceramic green sheet 3b so that the long sides of the wiring pattern 20b tilt at, for example, about −5 degrees with respect to the long sides of the ceramic green sheet 3b. In the wiring pattern 20b, a connecting portion 54b to connect to the via-conductor 54 is provided at the leading end, a connecting portion 56b to connect to the via-conductor 56 is provided on the left short side in FIG. 9, and a connecting portion 55b to connect to the via-conductor 55 is provided at the trailing end.

On the ceramic green sheet 3c, the wiring pattern 20c is formed. The wiring pattern 20c is formed to rotate through one revolution counterclockwise in FIG. 9 starting from a portion near the middle of the bottom long side of the ceramic green sheet 3c to extend along the individual sides in FIG. 9. A gap is formed between the leading end and the trailing end of the wiring pattern 20c. At the leading end of the wiring pattern 20c, the end portion 21 to connect to the electrode 4b is formed. In the wiring pattern 20c, a connecting portion 54c to connect to the via-conductor 54 is provided at the leading end, a connecting portion 56c to connect to the via-conductor 56 is provided on the left short side in FIG. 9, and a connecting portion 55c to connect to the via-conductor 55 is provided at the trailing end. Additionally, the wiring pattern 20c has been rotated and shifted clockwise with respect to the position of the ceramic green sheet 3c so that the long sides of the wiring pattern 20c tilt at, for example, about 5 degrees with respect to the long sides of the ceramic green sheet 3c.

By stacking the three ceramic green sheets 3a through 3c, the second wiring patterns 20 shown in FIG. 8 are formed.

On the ceramic green sheet 3d, the wiring pattern 30a is formed. The wiring pattern 30a is formed to rotate through one revolution counterclockwise in FIG. 9 starting from a portion near the middle of the left short side of the ceramic green sheet 3d to extend along the individual sides in FIG. 9. A gap is formed between the leading end and the trailing end of the wiring pattern 30a. In the wiring pattern 30a, a connecting portion 56d to connect to the via-conductor 56 is provided at the leading end, a connecting portion 55d to connect to the via-conductor 55 is provided on the bottom long side in FIG. 9, a connecting portion 57a to connect to the via-conductor 57 is provided on the right short side in FIG. 9, a connecting portion 52d to connect to the via-conductor 52 is provided on the top long side in FIG. 9, and a connecting portion 53d to connect to the via-conductor 53 is provided at the trailing end. Additionally, the wiring pattern 30a has been rotated and shifted counterclockwise with respect to the position of the ceramic green sheet 3d so that the long sides of the wiring pattern 30a tilt at, for example, about −5 degrees with respect to the long sides of the ceramic green sheet 3d.

On the ceramic green sheet 3e, the wiring pattern 30b is formed. The configuration of the wiring pattern 30b is the same or substantially the same as the wiring pattern 30a formed on the ceramic green sheet 3d. The wiring pattern 30b has been rotated and shifted clockwise with respect to the position of the ceramic green sheet 3e. That is, the wiring pattern 30b has been rotated and shifted clockwise with respect to the position of the ceramic green sheet 3e so that the long sides of the wiring pattern 30b tilt at, for example, about 5 degrees with respect to the long sides of the ceramic green sheet 3e. In the wiring pattern 30b, a connecting portion 56e to connect to the via-conductor 56 is provided at the leading end, a connecting portion 55e to connect to the via-conductor 55 is provided on the bottom long side in FIG. 9, a connecting portion 57b to connect to the via-conductor 57 is provided on the right short side in FIG. 9, a connecting portion 52e to connect to the via-conductor 52 is provided on the top long side in FIG. 9, and a connecting portion 53e to connect to the via-conductor 53 is provided at the trailing end.

On the ceramic green sheet 3f, the wiring pattern 30c is formed. The wiring pattern 30c is formed to rotate through one revolution counterclockwise in FIG. 9 starting from a portion near the middle of the left short side of the ceramic green sheet 3f to extend along the individual sides in FIG. 9. A gap is formed between the leading end and the trailing end of the wiring pattern 30c. In a middle portion of the right short side of the wiring pattern 30c in FIG. 9, the end portion 31 to connect to the electrode 4c is formed. In the wiring pattern 30c, a connecting portion 56f to connect to the via-conductor 56 is provided at the leading end, a connecting portion 55f to connect to the via-conductor 55 is provided on the bottom long side in FIG. 9, a connecting portion 57c to connect to the via-conductor 57 is provided on the right short side in FIG. 9, a connecting portion 52f to connect to the via-conductor 52 is provided on the top long side in FIG. 9, and a connecting portion 53f to connect to the via-conductor 53 is provided at the trailing end. Additionally, the wiring pattern 30c has been rotated and shifted counterclockwise with respect to the position of the ceramic green sheet 3f so that the long sides of the wiring pattern 30c tilt at, for example, about −5 degrees with respect to the long sides of the ceramic green sheet 3f.

By stacking the three ceramic green sheets 3d through 3f, the third wiring patterns 30 shown in FIG. 8 are formed.

On the ceramic green sheet 3g, the wiring pattern 10a is formed. The wiring pattern 10a is formed to rotate through one revolution clockwise in FIG. 9 starting from a portion near the middle of the top long side of the ceramic green sheet 3g to extend along the individual sides in FIG. 9. A gap is formed between the leading end and the trailing end of the wiring pattern 10a. In the wiring pattern 10a, a connecting portion 51a to connect to the via-conductor 51 is provided at the leading end, a connecting portion 53g to connect to the via-conductor 53 is provided on the left short side in FIG. 9, and a connecting portion 52g to connect to the via-conductor 52 is provided at the trailing end. Additionally, the wiring pattern 10a has been rotated and shifted clockwise with respect to the position of the ceramic green sheet 3g so that the long sides of the wiring pattern 10a tilt at, for example, about 5 degrees with respect to the long sides of the ceramic green sheet 3g.

On the ceramic green sheet 3h, the wiring pattern 10b is formed. The configuration of the wiring pattern 10b is the same or substantially the same as the wiring pattern 10a formed on the ceramic green sheet 3g. The wiring pattern 10b has been rotated and shifted counterclockwise with respect to the position of the ceramic green sheet 3h. That is, the wiring pattern 10b has been rotated and shifted counterclockwise with respect to the position of the ceramic green sheet 3h so that the long sides of the wiring pattern 10b tilt at, for example, about −5 degrees with respect to the long sides of the ceramic green sheet 3h. In the wiring pattern 10b, a connecting portion 51b to connect to the via-conductor 51 is provided at the leading end, a connecting portion 53h to connect to the via-conductor 53 is provided on the left short side in FIG. 9, and a connecting portion 52h to connect to the via-conductor 52 is provided at the trailing end.

On the ceramic green sheet 3i, the wiring pattern 10c is formed. The wiring pattern 10c is formed to rotate through one revolution clockwise in FIG. 9 starting from a portion near the middle of the top long side of the ceramic green sheet 3i to extend along the individual sides in FIG. 9. A gap is formed between the leading end and the trailing end of the wiring pattern 10c. At the leading end of the wiring pattern 10c, the end portion 11 to connect to the electrode 4a is formed. In the wiring pattern 10c, a connecting portion 51c to connect to the via-conductor 51 is provided at the leading end, a connecting portion 53i to connect to the via-conductor 53 is provided on the left short side in FIG. 9, and a connecting portion 52i to connect to the via-conductor 52 is provided at the trailing end. Additionally, the wiring pattern 10c has been rotated and shifted clockwise with respect to the position of the ceramic green sheet 3i so that the long sides of the wiring pattern 10c tilt at, for example, about 5 degrees with respect to the long sides of the ceramic green sheet 3i.

By stacking the three ceramic green sheets 3g through 3i, the first wiring patterns 10 shown in FIG. 8 are formed.

In the coil component 1a, the plural ceramic green sheets 3a through 3i shown in FIG. 9, each of which includes at least one corresponding sheet, are stacked on each other, and plural ceramic green sheets (dummy layers) without wiring patterns printed thereon are stacked on top and bottom surfaces of the stacked ceramic green sheets 3a through 3i. The multiple ceramic green sheets including the dummy layers are pressure-bonded to each other, thus forming the multilayer body 3 (ceramic base body) which is not yet fired. Then, the formed multilayer body 3 is fired, and copper electrodes are burned onto the exterior of the fired multilayer body 3 so that they are electrically connected to the wiring patterns, thus forming the electrodes 4a through 4d.

In the coil component 1a, multiple ceramic green sheets on which the first wiring patterns 10, the second wiring patterns 20, and the third wiring patterns 30 of the coils L1 and L2 are formed are stacked on each other. Because of this configuration, in the coil component 1a, the wiring patterns that have been rotated and shifted clockwise with respect to the corresponding ceramic green sheets and the wiring patterns that have been rotated and shifted counterclockwise with respect to the corresponding ceramic green sheets are alternately stacked on each other. In the coil component 1a, each of the wiring patterns is disposed to include an intersecting portion with another wiring pattern so that the corresponding sides of the wiring patterns intersect with each other as viewed from the direction of the main surfaces. The angle at which each of the wiring patterns intersects with another wiring pattern is, for example, about 10 degrees. With this configuration, in the coil component 1a, variations of magnetic coupling between the wiring patterns caused by a stacking misalignment can be reduced.

As described above, in the coil component 1a according to the second preferred embodiment, each of the wiring patterns is disposed to include an intersecting portion with another wiring pattern so that the corresponding sides of the wiring patterns intersect with each other as viewed from the direction of the main surfaces. However, each of the wiring patterns may be displaced from another wiring pattern in a different manner from the coil component 1a shown in FIG. 8. In the coil component, the coil L1 may include plural first wiring patterns, and the plural first wiring patterns may include at least one combination of wiring patterns that are stacked on each other with a positional displacement so as to include an intersecting portion. The coil L2 may include plural second wiring patterns, and the plural second wiring patterns 20 may include at least one combination of wiring patterns that are stacked on each other with a positional displacement so as to include an intersecting portion. In the coil component, each of the coils L1 and L2 may include at least one combination of wiring patterns that are stacked on each other with a positional displacement so as to include an intersecting portion.

With this configuration, in the coil component 1a of the second preferred embodiment, even with the occurrence of a stacking misalignment between layers of wiring patterns, variations of the value of mutual inductance M can be reduced. It is thus possible to manufacture the coil component 1a so that mutual inductance M can be maintained at a constant or substantially constant value.

Third Preferred Embodiment

In the first and second preferred embodiments, one wiring pattern has been rotated and shifted by, for example, about 5 degrees (clockwise), while another wiring pattern has been rotated and shifted by, for example, about −5 degrees (counterclockwise), so that the intersecting angle of the wiring patterns is, for example, about 10 degrees. However, the coil component is not limited to this configuration, and the above-described angle may be other than about 10 degrees. In a third preferred embodiment of the present invention, the intersecting angle of wiring patterns will be discussed. In the third preferred embodiment, the configuration of a coil component is the same or substantially the same as the coil component 1 of the first preferred embodiment or the coil component 1a of the second preferred embodiment, except for the intersecting angle of wiring patterns, and a detailed explanation thereof will not be repeated.

As the intersecting angle of wiring patterns is larger, the influence of a stacking misalignment becomes smaller, but the inductance value of a coil including wiring patterns also becomes smaller. When the intersecting angle of wiring patterns is about 90 degrees, coupling between the wiring patterns theoretically becomes zero. If a coil has the shape of a loop including wiring patterns as shown in FIG. 1, the long sides of one wiring pattern match the short sides of another wiring pattern when the intersecting angle is about 90 degrees. The intersecting angle of wiring patterns is thus set to be about 45 degrees or smaller, for example.

When wiring patterns are arranged to intersect with each other within a multilayer body of a certain size, corners of the wiring patterns extend to outside the multilayer body if the intersecting angle is large.

Figure 10A:
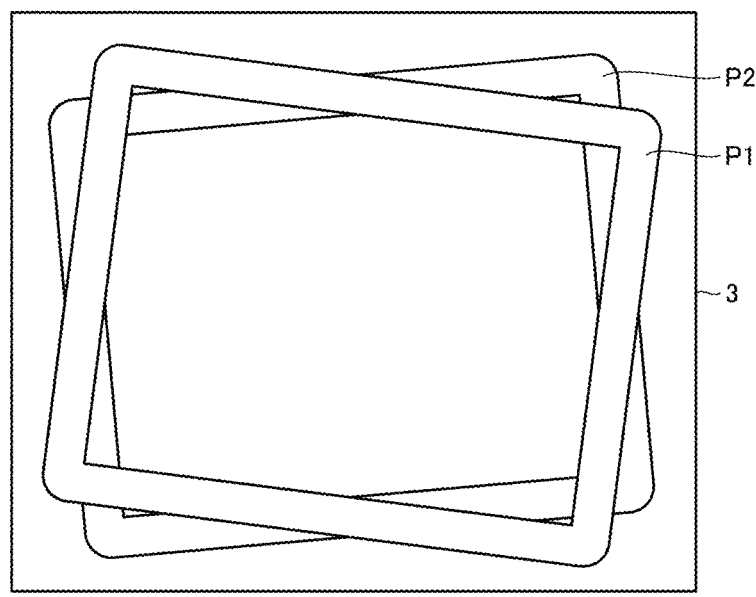
FIGS. 10A and 10B illustrate the positional relationship between a multilayer body and wiring patterns as viewed from the direction of main surfaces.
Figure 10B:
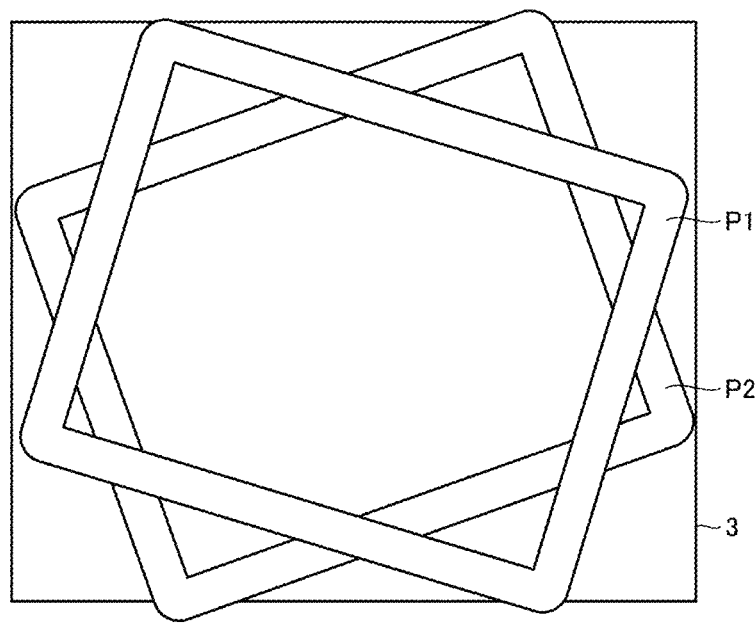

FIGS. 10A and 10B illustrate the positional relationship between a multilayer body and wiring patterns as viewed from the direction of the main surfaces. In FIG. 10A, the intersecting angle of wiring patterns P1 and P2 is relatively small, and the wiring patterns P1 and P2 are included within the multilayer body 3. In contrast, in FIG. 10B, the intersecting angle of the wiring patterns P1 and P2 is relatively large, and the wiring patterns P1 and P2 are not included within the multilayer body 3. The wiring patterns P1 and P2 are provided on different layers inside the multilayer body 3 and are seen from the direction of the main surfaces in a plan view of FIGS. 10A and 10B.

To dispose a coil including wiring patterns within the quadrilateral multilayer body 3, it is not possible to provide the coil with a large size, which may fail to obtain a desired value of mutual inductance M. That is, within the multilayer body 3, the proportion of wiring patterns that do not contribute to the formation of a coil is increased, which makes it difficult to reduce the size of the coil component. From this point of view, as shown in FIGS. 10A and 10B, the intersecting angle of the wiring patterns P1 and P2 is preferably in a range of, for example, about 5 degrees to about 30 degrees so that the wiring patterns P1 and P2 can be included in the multilayer body 3.

Figure 11A:
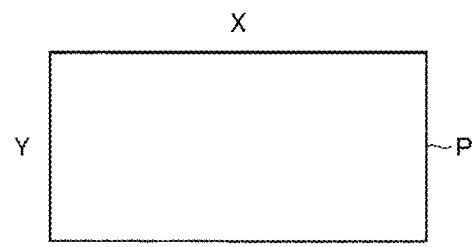
FIGS. 11A to 11C illustrate the size of wiring patterns.
Figure 11B:
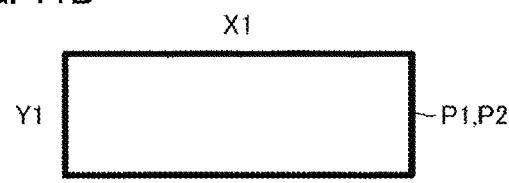
Figure 11C:
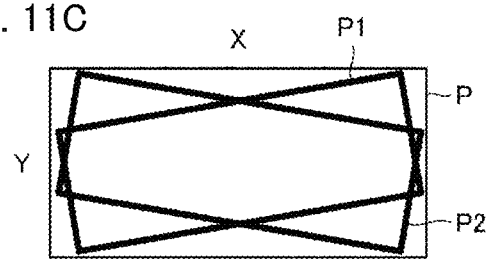
Figure 12:
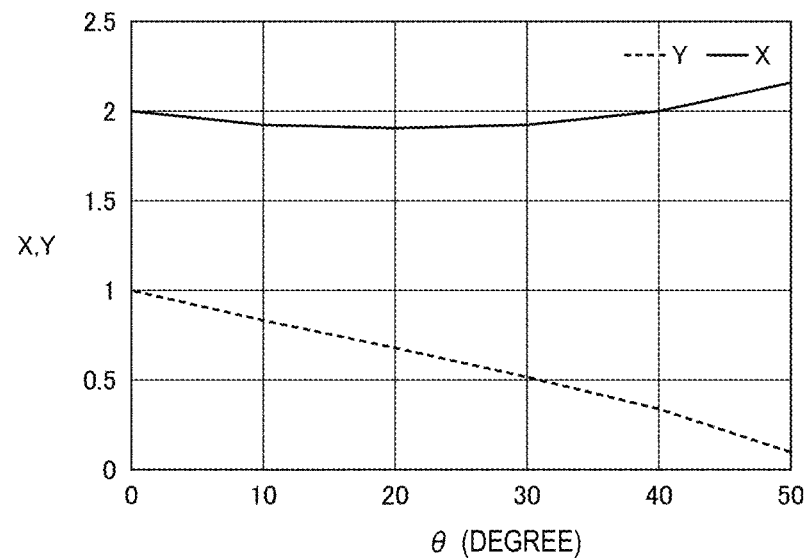
FIG. 12 is a graph illustrating the relationship between the size of wiring patterns and the intersecting angle therebetween.

FIGS. 11A to 11C illustrate the size of wiring patterns. FIG. 12 is a graph illustrating the relationship between the size of wiring patterns and the intersecting angle therebetween. To provide wiring patterns P1 and P2 to be included within the multilayer body 3, a wiring pattern P, which is not rotated with respect to the multilayer body 3, is first set, as shown in FIG. 11A. This wiring pattern P has a length X in the horizontal direction of FIGS. 11A to 11C and a length Y in the vertical direction in FIGS. 11A to 11C. To store the wiring pattern P within the multilayer body 3 when it is rotated and shifted clockwise or counterclockwise, it is necessary that the wiring pattern P is reduced to wiring patterns P1 and P2 with a horizontal length X1 (<X) and a vertical length Y1 (<Y), as shown in FIG. 11B. That is, as shown in FIG. 11C, the wiring patterns P1 and P2 with the horizontal length X1 and the vertical length Y1 are stored within the wiring pattern P having the horizontal length X and the vertical length Y.

The intersecting angle of the wiring patterns P1 and P2 is represented by θ, and the horizontal length X and the vertical length Y of the wiring patterns P1 and P2 are changed with respect to the angle θ, as shown in FIG. 12. While the horizontal length X of the wiring patterns P1 and P2 is not changed considerably with respect to the angle θ, the vertical length Y of the wiring patterns P1 and P2 is changed considerably with respect to the angle θ. The overlapping area of the wiring patterns P1 and P2 correlates with the inductance value. It is thus preferable that the intersecting angle of the wiring patterns P1 and P2 is limited to a certain range so that the overlapping area of the wiring patterns P1 and P2 is at least half of the area of each of the wiring patterns P1 and P2. The intersecting angle of the wiring patterns P1 and P2 is preferably, for example, about 30 degrees or smaller, as is seen from FIG. 12.

As described above, in the coil component according to the third preferred embodiment, at the intersecting portion of wiring patterns, the corresponding sides of the wiring patterns intersect with each other preferably at, for example, about 5 degrees to about 30 degrees as viewed from the direction of the main surfaces. With this arrangement, the coil component of the third preferred embodiment can reduce variations of the value of mutual inductance M and can also be decreased in size.

Modified Examples

Figure 13:
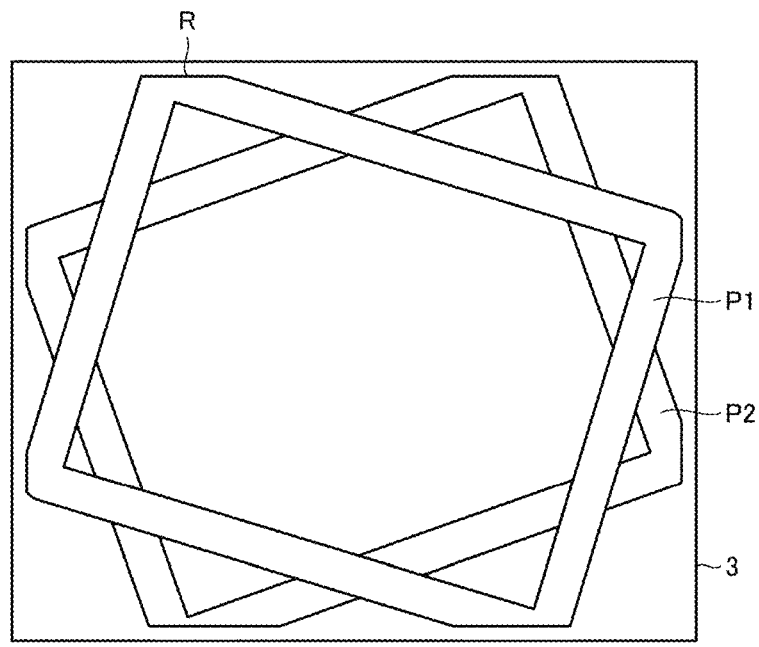
FIG. 13 illustrates the shape of wiring patterns with corner portions removed.

In the above-described coil components according to preferred embodiments of the present invention, wiring patterns are arranged to be stored in the multilayer body 3. Depending on the arrangement of wiring patterns, however, corners of wiring patterns may extend to outside the multilayer body 3. In this case, the corners of wiring patterns extending to outside the multilayer body 3 may be removed. FIG. 13 illustrates the shape of wiring patterns with corner portions removed. Wiring patterns P1 and P2 are stacked on each other with a positional displacement so as to include an intersecting portion. Portions R of the wiring patterns P1 and P2 close to the side surfaces of the multilayer body 3 are partially removed, as shown in FIG. 13. With this arrangement, in the resulting coil component, the area of the wiring patterns occupied on the main surfaces of the multilayer body 3 can be made small even if the intersecting angle of the wiring patterns P1 and P2 is increased. The wiring patterns P1 and P2 are provided on different layers inside the multilayer body 3 and are seen from the direction of the main surfaces in a plan view of FIG. 13.

In coil components according to preferred embodiments of the present invention, the shifting directions of wiring patterns may be changed alternately layer by layer, or wiring patterns which are considerably influenced by magnetic coupling may only be shifted. In the coil components of the disclosure, the shape of wiring patterns is not limited to a rectangle or substantially a rectangle and may be an ellipse or a polygon.

In coil components according to preferred embodiments of the present invention, in addition to reducing variations of the value of mutual inductance M, the value of stray capacitance between the two coils L1 and L2 can also be made less vulnerable to a stacking misalignment. That is, when wiring patterns are displaced to intersect with each other, capacitance is generated only in the intersecting portions between the wiring patterns, thus reducing variations of the capacitance.

In coil components according to preferred embodiments of the present invention, an angular misalignment may occur in the rotating direction in the XY plane in FIG. 1, as well as a stacking misalignment in the X and Y directions in FIG. 1. In a manufacturing method for forming many coil components by forming multiple wiring patterns on ceramic green sheets and by stacking them, large ceramic green sheets are used. An angular misalignment, if it occurs, is as small as about 0.1 degrees or less, which produces little influence on variations of the value of mutual inductance M.

Figure 14A:
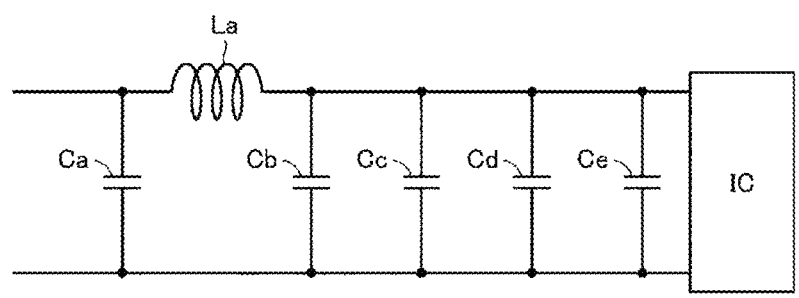
FIGS. 14A and 14B illustrate the circuit configurations of a noise filter used in a power supply circuit according to a preferred embodiment of the present invention.
Figure 14B:
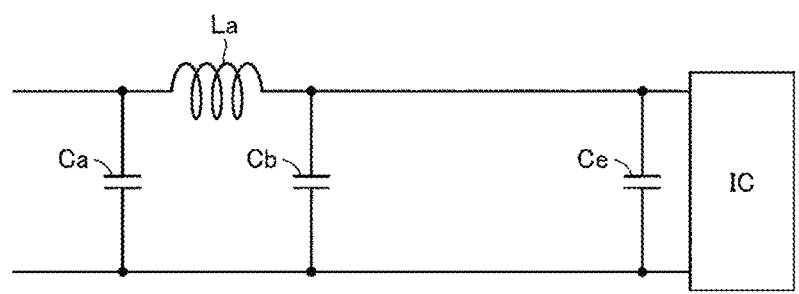

Filter circuits each including at least one of the coil components according to preferred embodiments of the present invention can be used as a noise filter in a power supply circuit, for example. FIGS. 14A and 14B illustrate the circuit configurations of a noise filter used in a power supply circuit. The circuit shown in FIG. 14A is an example of a noise filter disposed in the path to supply power to an IC element. This noise filter includes a pi filter circuit and capacitors Cc and Cd connected to the pi filter circuit. The pi filter circuit includes a capacitor Ca, a coil La, which is an inductor, and a capacitor Cb. The pi filter circuit mainly blocks low-frequency noise included in power supplied from a power supply, while the capacitors Cc and Cd mainly block high-frequency noise included in power supplied from the power supply.

The capacitors Cc and Cd define and function as a low pass filter (LPF) circuit that blocks high-frequency noise. Increasing the number of capacitors of the low pass filter can reduce parasitic inductance (equivalent series inductance (ESL)) while blocking high-frequency noise. A capacitor Ce included in the circuit shown in FIG. 14A stores electric charge to be supplied to an IC element in case of a shortage of a current to be supplied to the IC element. The capacitor Ce is disposed near the IC element so as to prevent inductance components from interfering between the capacitor Ce and the IC element.

When the coil component 1 or 1a according to preferred embodiments of the present invention may be applied to the circuit configuration in FIG. 14A, it can also provide a function similar to the low pass filter circuit. The capacitors Cc and Cd of the low pass filter circuit can thus be eliminated, as shown in FIG. 14B.

Figure 15A:
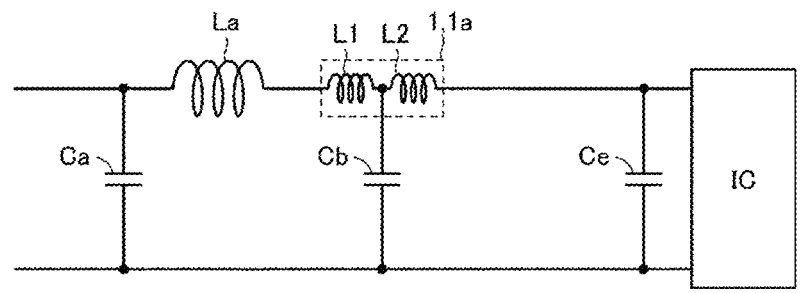
FIGS. 15A to 15C illustrate the circuit configurations of a noise filter in a power supply circuit including a coil component according to a preferred embodiment of the present invention.
Figure 15B:
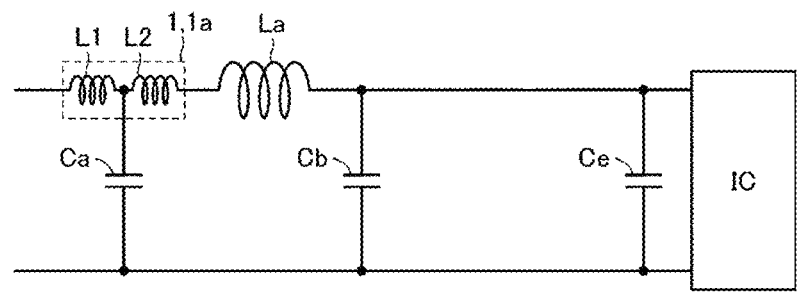
Figure 15C:
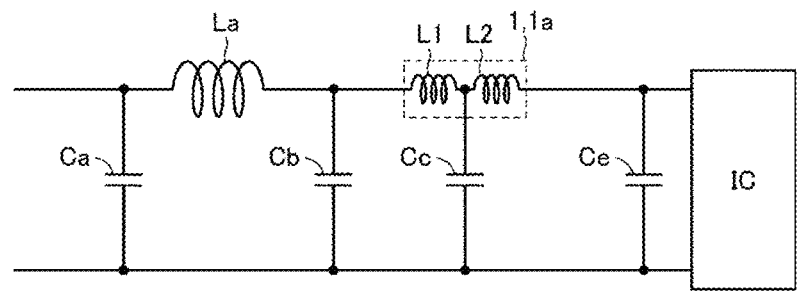

The configuration of a noise filter in a power supply circuit including the coil component 1 or 1a will be described below with reference to the drawings. FIGS. 15A to 15C illustrate the circuit configurations of a noise filter in a power supply circuit including the coil component 1 or 1a. In the circuit in FIG. 15A, the coil component 1 or 1a is used for the capacitor Cb. In this case, the noise filter in a power supply circuit is, for example, a fifth-order T-type LC filter circuit (low pass filter (LPF) circuit) including a capacitor Ca, a pair of a coil La and a coil L1, a capacitor Cb, a coil L2, and a capacitor Ce.

The filter circuit shown in FIG. 15A includes the capacitor Ca (first capacitor) and the capacitor Cb (second capacitor) connected in parallel between the IC element (load) and the power supply, the coil La (inductor) connected in series between the capacitor Ca (first capacitor) and the capacitor Cb (second capacitor), and the coil component 1 or 1a in which the coil L1 (first coil) is disposed to be connected in series between the capacitor Cb (second capacitor) and the coil La (inductor). With this configuration, the filter circuit in FIG. 15A achieves high filter characteristics with a small number of components. When the coil component 1 or 1a is used in a noise filter in a power supply circuit, the position of the coil component 1 or 1a becomes different depending on for which of the capacitors Ca, Cb, and Ce parasitic inductance (equivalent series inductance (ESL)) is to be reduced. The coil component 1 or 1a has inductance components by itself, and if it is applied to the capacitor Ce, the inductance components interfere between the capacitor Ce and the IC element, which decreases the capability of the capacitor Ce to supply electric charge to the IC element. It is thus preferable to avoid using the coil component 1 or 1a for the capacitor Ce.

Instead of applying the coil component 1 or 1a to the capacitor Cb, the coil component 1 or 1a may be used for the capacitor Ca. In the circuit shown in FIG. 15B, the coil component 1 or 1a is applied to the capacitor Ca. In this case, the noise filter in a power supply circuit is, for example, a fourth-order T-type LC filter circuit (low pass filter (LPF) circuit) including the coil L1, the capacitor Ca, a pair of the coil L2 and the coil La, and the capacitor Cb.

If a capacitor Cc is disposed between the capacitors Cb and Ce, the coil component 1 or 1a is applicable to the capacitor Cc, as shown in FIG. 15C. In this case, the noise filter in a power supply circuit is, for example, a seventh-order T-type LC filter circuit (low pass filter (LPF) circuit) including the capacitor Ca, the coil La, the capacitor Cb, the coil L1, the capacitor Cc, the coil L2, and the capacitor C5. The filter circuit shown in FIG. 15C includes the capacitor Ca (first capacitor) and the capacitor Cc (second capacitor) connected in parallel between the IC element (load) and the power supply, the coil La (inductor) connected in series between the capacitor Ca (first capacitor) and the capacitor Cc (second capacitor); and the coil component 1 or 1a in which the coil L1 (first coil) is disposed to be connected in series between the capacitor Cc (second capacitor) and the coil La (inductor). The filter circuit in FIG. 15C also includes a capacitor Cb (third capacitor) connected in parallel with the capacitor Ca (first capacitor) and disposed between the coil La (inductor) and the coil L1 (first coil). With this configuration, the filter circuit in FIG. 15C achieves high filter characteristics with a small number of components.

The noise filtering effect of a noise filter in a power supply circuit is further improved when the noise filter is a higher-order filter circuit. It is thus preferable that the coil component 1 or 1a is located at a certain position so that a higher-order filter circuit can be provided.

Figure 16:
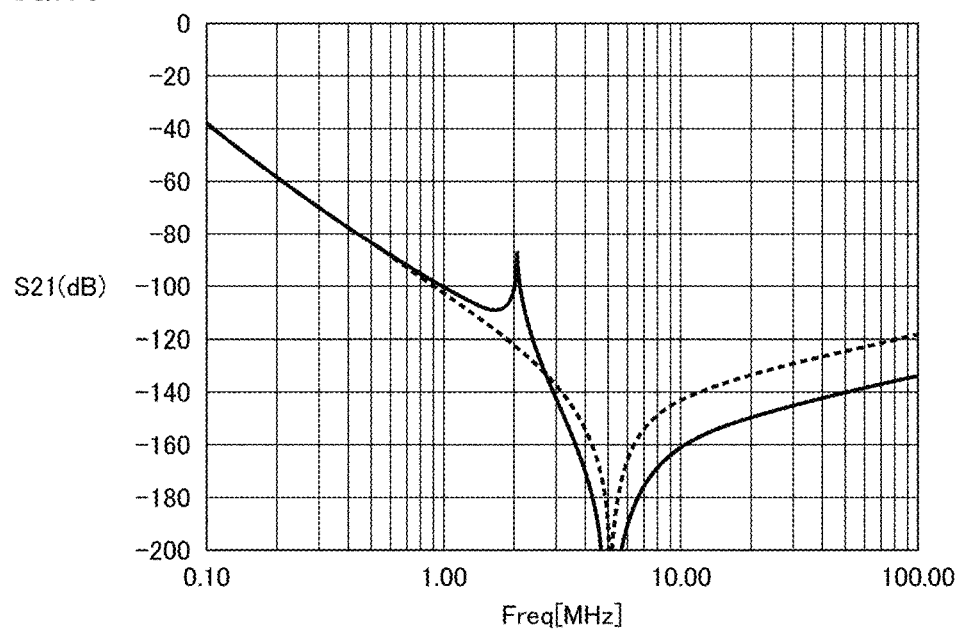
FIG. 16 is a graph illustrating the transmission characteristics of a noise filter in a power supply circuit including a coil component according to a preferred embodiment of the present invention in response to the frequency.

FIG. 16 is a graph illustrating the transmission characteristics of a noise filter in a power supply circuit including the coil component 1 or 1a in response to the frequency. The graph of FIG. 16 illustrates simulation results obtained by conducting circuit simulation for the fifth-order T-type LC filter circuit shown in FIG. 15A and the fourth-order T-type LC filter circuit shown in FIG. 15B. The circuit simulation was conducted for the fifth-order T-type LC filter circuit in FIG. 15A and the fourth-order T-type LC filter circuit in FIG. 15B under the conditions that the inductance of the coil La was about 10 µH, the capacitance of the capacitors Ca, Cb, and Ce was about 1 µF, the inductance of the coils L1 and L2 was about 10 nH, and the parasitic inductance (equivalent series inductance (ESL)) was about 1 nH. As seen in FIG. 16, the result (solid line) of the fifth-order T-type LC filter circuit shows that a larger attenuation is obtained in a higher frequency compared with the result (broken line) of the fourth-order T-type LC filter circuit.

In the above-described coil components, for each of a group of first wiring patterns, a group of second wiring patterns, and a group of third wiring patterns, three wiring patterns are stacked on each other. However, for each group, for example, at least two wiring patterns may be stacked on each other.

In the above-described coil components, the via-conductors 53 and 56 are electrically connected to all of the third wiring patterns 30. However, not all of the third wiring patterns may be electrically connected to the via-conductors 53 and 56. That is, the via-conductors 53 and 56 may be electrically connected to at least one of the plural third wiring patterns 30. In the coil component 1, mutual inductance of two coils can also be suitably adjusted in accordance with the number of wiring patterns electrically connected to the via-conductors 53 and 56.

The above-described coil component 1 includes the ceramic multilayer body 3 (ceramic base body) including multiple ceramic layers stacked on each other. The coil component 1 may be made of another dielectric material if it has a multilayer structure.

In the above-described coil component 1, the first wiring patterns, the second wiring patterns, and the third wiring patterns have a uniform thickness. Alternatively, the thicknesses of the first through third wiring patterns may be different.

Preferred embodiments of the present invention are provided only for the purposes of illustration, and are not intended to be exhaustive or to limit the invention to the precise structure and configuration disclosed. It is intended that the scope of the present invention be defined, not by the foregoing preferred embodiments, but by the following claims. The scope of the present invention is to be accorded a broad interpretation so as to encompass all such modifications and equivalent structures and functions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil component comprising:
   first and second coils magnetically coupled with each other;
   a ceramic base body including a plurality of ceramic layers stacked on each other, a pair of main surfaces opposing each other, and side surfaces connecting the main surfaces;
   at least one first wiring pattern inside the ceramic base body and defining at least a portion of the first coil;
   at least one second wiring pattern on a top layer of the first wiring pattern and defining at least a portion of the second coil; and
   at least one third wiring pattern between the first and second wiring patterns and including a portion defining a portion of the first coil and a portion defining a portion of the second coil; wherein
   each of the first and second wiring patterns has a rectangular or substantially rectangular shape;
   at least one of the first and second coils includes at least one combination of wiring patterns that are stacked on each other with a positional displacement so as to include an intersecting portion at which corresponding sides of the wiring patterns intersect with each other as viewed from a direction of the main surfaces;
   the first coil includes:
      a portion including a plurality of wiring patterns connected in parallel with each other which are provided by electrically connecting a plurality of the first wiring patterns with each other using a first via-conductor; and
      a portion including a plurality of wiring patterns connected in parallel with each other which are provided by electrically connecting a plurality of the first wiring patterns with each other and a plurality of the third wiring patterns with each other using second and third via-conductors which pass through the plurality of the first wiring patterns and the plurality of the third wiring patterns;
   the second coil includes:
      a portion including a plurality of wiring patterns connected in parallel with each other which are provided by electrically connecting a plurality of the second wiring patterns with each other using a fourth via-conductor; and
      a portion including a plurality of wiring patterns connected in parallel with each other which are provided by electrically connecting a plurality of the second wiring patterns with each other and a plurality of the third wiring patterns with each other using fifth and sixth via-conductors which pass through the plurality of the second wiring patterns and the plurality of the third wiring patterns; and
   the ceramic base body includes:
      a first electrode electrically connected to the plurality of first wiring patterns;
      a second electrode electrically connected to the plurality of second wiring patterns; and
      a third electrode electrically connected to the plurality of third wiring patterns which are connected to a plurality of wiring patterns connected with each other by a seventh via-conductor.

2. The coil component according to claim 1, wherein
   the first coil includes a plurality of the first wiring patterns; and
   the plurality of the first wiring patterns include at least one combination of wiring patterns stacked on each other with a positional displacement so as to include the intersecting portion.

3. The coil component according to claim 1, wherein
   the second coil includes a plurality of the second wiring patterns; and
   the plurality of the second wiring patterns include at least one combination of wiring patterns stacked on each other with a positional displacement so as to include the intersecting portion.

4. The coil component according to claim 1, wherein a combination of the first and third wiring patterns are stacked on each other with a positional displacement so as to include the intersecting portion.

5. The coil component according to claim 1, wherein a combination of the second and third wiring patterns are stacked on each other with a positional displacement so as to include the intersecting portion.

6. The coil component according to claim 1, wherein
   a portion of the plurality of first wiring patterns receiving the second via-conductor and a portion of the plurality of first wiring patterns receiving the third via-conductor face different side surfaces of the ceramic base body; and
   a portion of the plurality of second wiring patterns receiving the fifth via-conductor and a portion of the plurality of second wiring patterns receiving the sixth via-conductor face different side surfaces of the ceramic base body.

7. The coil component according to claim 1, wherein, in the intersecting portion, the corresponding sides of the wiring patterns intersect with each other at about 5 degrees to about 30 degrees as viewed from the direction of the main surfaces.

8. The coil component according to claim 1, wherein, in the at least one combination of wiring patterns that are stacked on each other with a positional displacement, a portion of at least one wiring pattern of the at least one combination of wiring patterns close to a side surface of the ceramic base body is partially removed.

9. A filter circuit comprising:
   the coil component according to claim 1; and a capacitor that is connected to an electrode disposed between the first and second coils of the coil component.

10. A filter circuit comprising:

first and second capacitors connected in parallel between a load and a power supply;

an inductor connected in series between the first and second capacitors; and the coil component according to claim 1 in which the first coil is connected in series between the second capacitor and the inductor.

11. The filter circuit according to claim 10, further comprising a third capacitor connected in parallel with the first capacitor and located between the inductor and the first coil.

12. The filter circuit according to claim 9, wherein the first coil includes a plurality of the first wiring patterns; and the plurality of the first wiring patterns include at least one combination of wiring patterns stacked on each other with a positional displacement so as to include the intersecting portion.

13. The filter circuit according to claim 9, wherein the second coil includes a plurality of the second wiring patterns; and the plurality of the second wiring patterns include at least one combination of wiring patterns stacked on each other with a positional displacement so as to include the intersecting portion.

14. The filter circuit according to claim 9, wherein a combination of the first and third wiring patterns are stacked on each other with a positional displacement so as to include the intersecting portion.

15. The filter circuit according to claim 9, wherein a combination of the second and third wiring patterns are stacked on each other with a positional displacement so as to include the intersecting portion.

16. The filter circuit according to claim 9, wherein a portion of the plurality of first wiring patterns receiving the second via-conductor and a portion of the plurality of first wiring patterns receiving the third via-conductor face different side surfaces of the ceramic base body; and a portion of the plurality of second wiring patterns receiving the fifth via-conductor and a portion of the plurality of second wiring patterns receiving the sixth via-conductor face different side surfaces of the ceramic base body.

* * * * *